US009279847B2

(12) United States Patent
Sun

(10) Patent No.: US 9,279,847 B2
(45) Date of Patent: Mar. 8, 2016

(54) METHOD FOR LOCATING FAULTS IN UNGROUNDED POWER DISTRIBUTION SYSTEMS

(71) Applicant: Mitsubishi Electric Research Laboratories, Inc., Cambridge, MA (US)

(72) Inventor: Hongbo Sun, Plymouth, MN (US)

(73) Assignee: MITSUBISHI ELECTRIC RESEARCH LABORATORIES, INC., Cambridge, MA (US)

( * ) Notice: Subject to any disclaimer, the term of this patent is extended or adjusted under 35 U.S.C. 154(b) by 572 days.

(21) Appl. No.: 13/772,430

(22) Filed: Feb. 21, 2013

(65) Prior Publication Data

US 2014/0236503 A1 Aug. 21, 2014

(51) Int. Cl.
*G01R 31/08* (2006.01)
(52) U.S. Cl.
CPC ............ *G01R 31/086* (2013.01); *Y04S 10/522* (2013.01)
(58) Field of Classification Search
CPC .... Y04S 10/522; G01R 31/08; G01R 31/088; G01R 21/06; G01R 31/025; G01R 31/086; H02H 1/0061; H02H 3/042; H02H 7/261; G06F 15/00; H02J 3/06
USPC ........... 702/58, 59, 61, 64; 324/509, 512, 522
See application file for complete search history.

(56) References Cited

U.S. PATENT DOCUMENTS

| 5,455,775 A * | 10/1995 | Huber ................. G06F 17/5072 361/679.4 |
| 6,721,671 B2 * | 4/2004 | Roberts ................ G01R 31/025 324/509 |
| 7,400,150 B2 * | 7/2008 | Cannon ................ H02H 1/0061 324/512 |
| 2012/0004867 A1 * | 1/2012 | Mousavi ............ G01R 31/3274 702/58 |

* cited by examiner

*Primary Examiner* — John H Le
(74) *Attorney, Agent, or Firm* — Gene Vinokur; Dirk Brinkman

(57) ABSTRACT

A method determines a location of a single-phase-to-ground fault in an ungrounded power distribution system. The method detects the faulty phase of the distribution system having the fault and compares a difference between an angle of a voltage and an angle of a current measured at a root of a faulty feeder and boundaries of each section of the faulty feeder to determine a faulty section of a faulty feeder having the fault. A line segment of the faulty section is tested for a change of a sign of a voltage on the faulty phase in the faulty section to determine a faulty line segment. The location of the fault is determined based on a distance from a terminal bus of the faulty line segment to a location along the faulty line segment having a value the voltage on the faulty phase equals zero.

19 Claims, 11 Drawing Sheets

100

200

300

400

500

600

700

800

900

1000

1100

METHOD FOR LOCATING FAULTS IN UNGROUNDED POWER DISTRIBUTION SYSTEMS

FIELD OF THE INVENTION

The present invention relates generally to power distribution systems; and more particularly to locating faults in ungrounded power distribution systems.

BACKGROUND OF THE INVENTION

Ungrounded power distribution systems are widely used, especially at medium voltage levels, e.g., less than 50 kV. Compared with the grounded distribution systems, the ungrounded systems do not have neural wires to connect with the ground, and they are connected to ground through phase-to-ground capacitances of power lines. When a single-phase-to-ground fault occurs, the fault currents of ungrounded systems are less than normal load currents, thus the system can continue to operate until the fault is corrected.

However, as a result of the fault, the lines of the power distribution system experience over-voltages, which can damage the lines when the fault is not corrected in a timely manner. Thus, fault detection and location estimation is important for the sale and stable operation of ungrounded power distribution systems.

Several methods have been used for locating single-phase-to-ground faults in ungrounded distribution systems. For example, a method described in U.S. Pat. No. 6,721,671 for determining a section of the system having a fault uses a directional element to determine faults on ungrounded power systems, which following enablement under selected input current conditions, determined zero sequence impedance, in response to values of zero sequence voltage and zero sequence current.

Another method described in US 2003/0085715, introduces a measurement signal having a measurement frequency on the line having a fault. The fault location is determined for a selected segment based on a measured residual current corresponding to the measurement signal, and a predetermined relative impedance of the power distribution system. However, usage of additional frequency measurements is not optimal for some applications.

Accordingly, there is a need for determining locations of single-phase-to-ground faults in ungrounded power distribution systems.

SUMMARY OF THE INVENTION

An objective of various embodiments of invention is to determine a location of a bolted single-phase-to-ground fault in an ungrounded power distribution system. Another objective, of some embodiments is to reduce a number of measurements required to determine the location of the fault. For example, an objective of one embodiment is to primarily use measurements at feeder breakers and switches.

Some embodiments are based on a realization that a task for locating the fault can be simplified and fewer measurements are required when the task of locating the fault is decomposed into a series of sequential sub-tasks with different level of details. For example, one embodiment decomposes the task of locating the fault into determining the faulty phase and faulty feeder having the fault, determining the faulty section of the faulty feeder, determining the faulty line segment of the faulty section, and determining the exact location of the fault in the faulty line segment.

This decomposition approach also allows decomposing the complexity of measurements, i.e., only a limited subset of measurements is required for each step with a degree of details of measurements increasing during the locating process. For example, determining the faulty feeder requires only the measurements at a root, e.g., the most upstream bus of the feeders, which are provided directly at a substation. The determination of the faulty section only requires limited additional measurements from switches with sensors of the faulty feeder. For example, the faulty feeder and the faulty section can be determined based on a difference between a phase angle of a voltage and a phase angle of a current measured at a root of faulty feeder, or at the boundaries of the faulty section.

Determining the faulty section of the feeder can be sufficient for some systems. However, for a number power distribution system the section of the feeder can include a complex topology of the line segments with boundaries defined, e.g., by buses. Thus, there is a need to determine a faulty line segment in the faulty section. Also, a length of the faulty line segment can be substantial, thus, there is a need to determine the exact location of the fault in that faulty line segment.

Some embodiments are based on another realization that the phase-to-ground voltage on the faulty phase of the location of the bolted single-phase-to-ground fault is zero, and, thus, a sign of a voltage on the faulty phase within the faulty line segment is changing if the fault currents are applied across the line segment. Some embodiments exploit this realization for determining the faulty line segment. For example, one embodiment tests at least some of the line segment of the faulty section for a change of the sign of the voltage on the faulty phase to determine a faulty line segment.

Knowing the faulty line segment, the location of the fault can be determined based on a distance from a terminal bus of the faulty line segment to a location along the faulty line segment having a zero voltage on the faulty phase. For example, one embodiment determines this distance based on proportionality of the distance with impedance of the line segment and a proportionality of the distance with a shunt admittance of the line segment.

In addition, some embodiments of the invention provide a system and a method for determining power consumption of a load in a feeder section of an ungrounded power distribution system. The embodiments are based on a realization that the power consumption can be first determined based on a load profile of the load and later adjusted based on a mismatch of target active powers determined, based on measurements at an importing measuring device of the feeder section and active powers determined based on the estimated power consumption. The embodiments can perform adjustment of the power consumption iteratively, until a difference between the active and the target active powers is less than a threshold.

Some embodiments are based on a realization that target active power measured during the fault should be adjusted with shunt currents of line segments of the feeder section. Accordingly, one embodiment determine the shunt currents of the line segments based on a shunt admittance of a line segment and voltages of buses defining the line segment, and removes contribution of the shunt current resulting from a single-phase-to-ground fault in determining the target active power.

Some embodiments based on another realization that clue to a DELTA connection of the loads, the power consumption of the loads should be adjusted based on phase-to-phase power. However, the measurements of some ungrounded power distribution system are provided by each phase. According y, some embodiments transform components of the active or target active powers to determined phase-to-phase difference between the active and target active powers. For example, one embodiment uses a WYE-DELTA transformation of equivalent resistances of active powers to determine the phase-to-phase difference. Another embodiment determine the phase-to-phase difference using incremental phase-to-phase currents which determined by the current mismatches for each phase determined at importing measuring device of the feeder section.

Accordingly, one embodiment discloses a method for determining a location of a fault in an ungrounded power distribution system, wherein the power distribution system includes a set of feeders connected to a substation, wherein each feeder includes a set of loads connected by line segments and each line segment is defined by a pair of buses, and the fault is a bolted single-phase-to-ground fault. The method includes detecting the fault on a faulty phase in the distribution system having the fault; comparing, in response to detecting the fault, a difference between an phase angle of a voltage and a phase angle of a current measured at a root of each feeder from the set of feeders to determine a faulty feeder having the fault; comparing a difference between a phase angle of a voltage and a phase angle of a current measured at boundaries of each section of the faulty feeder to determine a faulty section having the fault; testing each line segment of the faulty section for a change of a sign of a voltage on the faulty phase in the faulty section to determine a faulty line segment; and determining a distance from a terminal bus of the faulty line segment to a location along the faulty line segment having a value the voltage on the faulty phase equals zero to produce the location of the fault. The steps of the method are performed by a processor.

Another embodiment discloses a system for determining a location of a fault in an ungrounded power distribution system, wherein the power distribution system includes a set of feeders connected to a substation, wherein each feeder includes a set of loads connected by line segments and each line segment is defined by a pair of buses, and the fault is a bolted single-phase-to-ground fault. The system includes a processor for comparing, in response to detecting, the fault on a faulty phase of a wire in the distribution system, a difference between an angle of a voltage and an angle of a current measured at a root of each feeder from the set of feeders to determine a faulty feeder having the fault; comparing a difference between an angle of a voltage and an angle of a current measured at boundaries of each section of the faulty feeder to determine a faulty section having the fault; testing each line segment of the faulty section for a change of a sign of a voltage on the faulty phase in the faulty section to determine a faulty line segment; and determining, a distance from a terminal bus of the faulty line segment to a location along the faulty line segment having a value the voltage on the faulty phase equals zero based on proportionality of the distance with impedance of the line segment and a proportionality of the distance with a shunt admittance of the line segment to produce the location of the fault.

DETAILED DESCRIPTION OF THE PREFERRED EMBODIMENTS

Ungrounded Distribution System and Measurements

Figure 1:
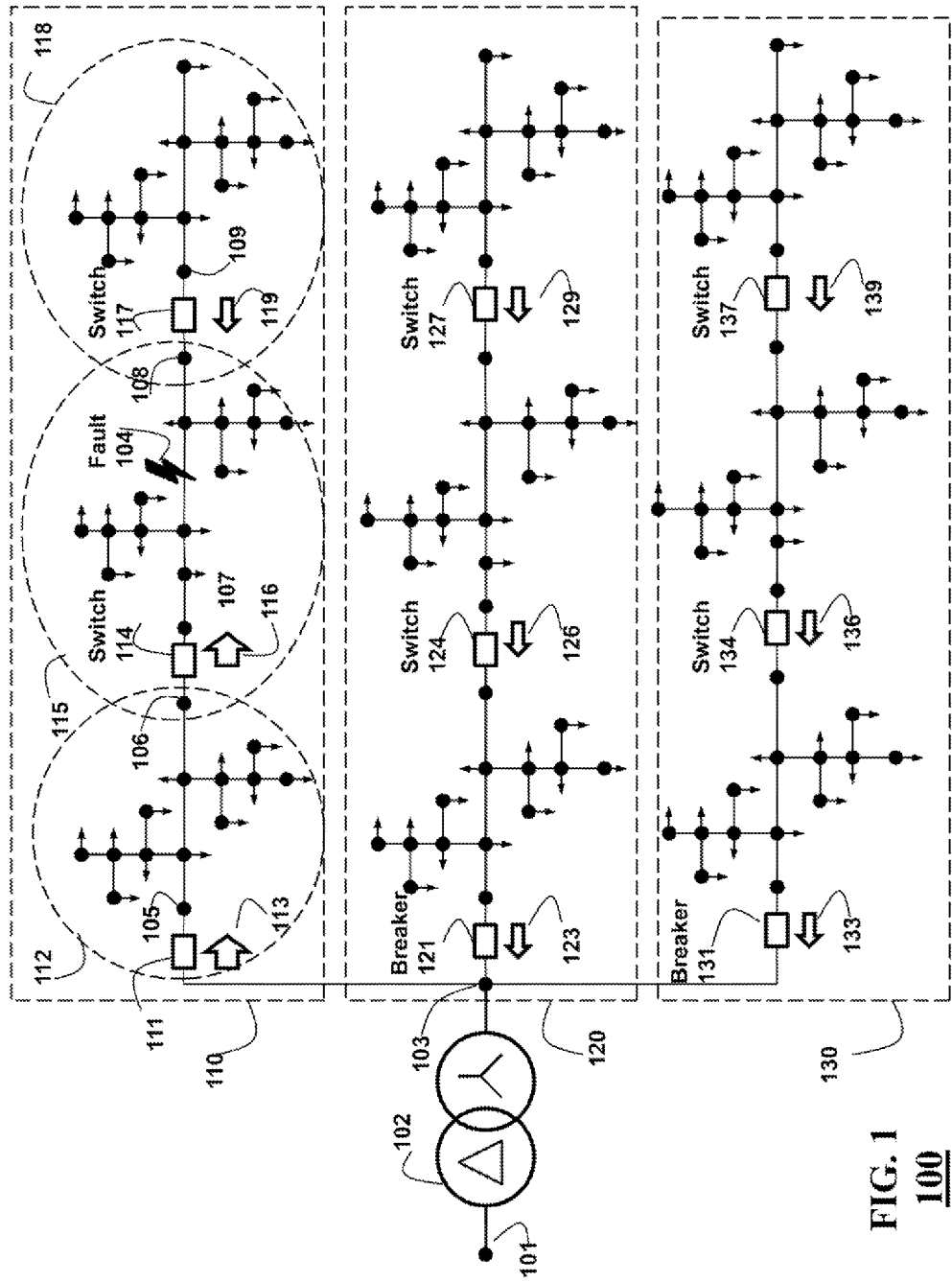
FIG. 1 is a schematic of an exemplar ungrounded distribution system.

FIG. 1 shows an example of ungrounded distribution system 100 with a single-phase-to-ground fault 104. A distribution system 100 includes a distribution substation in which a three-phase transformer 102 receives electric power from power transmission systems, and provides the power to downstream feeders via an upstream bus 101 and a downstream bus 103 connected to the transformer 102.

The windings of the transformer 102 are ungrounded, either using WYE or DELTA connection. For example, in the FIG. 1, the primary winding of the transformer uses the DELTA connection, and secondary winding uses WYE connection. The feeder transfers powers to the loads through three-phase three-wire lines. All loads can be DELTA connected. Each feeder can have several switchable and measured devices, and measuring units attached to those devices can provide three-phase voltage and three-phase current measurements.

In the example of FIG. 1, the transformer 102 is connected to three feeders, a feeder 110, a feeder 120 and a feeder 130. Each feeder can include one feeder breaker at its root, e.g., breakers 111, 121, and 131. The feeders can also include switches defining sections of the feeders. For example, the feeder 110 includes a switch 114 and a switch 117. The feeder 120 includes a switch 124 and a switch 127. The feeder 130 includes a switch 134 and a switch 137. The switchers can include sensors for measuring voltages, currents or both.

Distribution networks are typically of two types, radial or interconnected. The distribution system 100 operates radially, i.e., power leaves the station and passes through the network, area with no connection to any other power supply.

According to the location of switchable and measured devices, a feeder can be partitioned into several feeder sections. Each feeder section can have one importing measuring device at the root of the section for providing power to this section, and several exporting measuring devices at the downstream boundaries of the section for providing power to subsequent feeder sections. All line segments or devices between the importing and the exporting measuring devices are part of the feeder section.

For example, the feeder 110 can be partitioned into three feeder sections, section 112, section 115, and section 118. The feeder section 112 includes all the line segments or devices between the upstream bus 103 of breaker and upstream bus 106 of switch 114, and includes one importing measuring device located at breaker 111, and one exporting measuring device located at switch 114. The section 115 is defined by all the line segments or devices between the upstream bus 106 of switch 114, and upstream bus 108 of switch 117, and includes one importing measuring device located at switch 114, and one exporting measuring device located at switch 117. The feeder section 118 is defined as all line segments or devices downstream to the upstream bus 108 of switch 117, and includes one importing measuring device located at switch 117. Feeder section 118 does not have any exporting measuring device.

Figure 2:
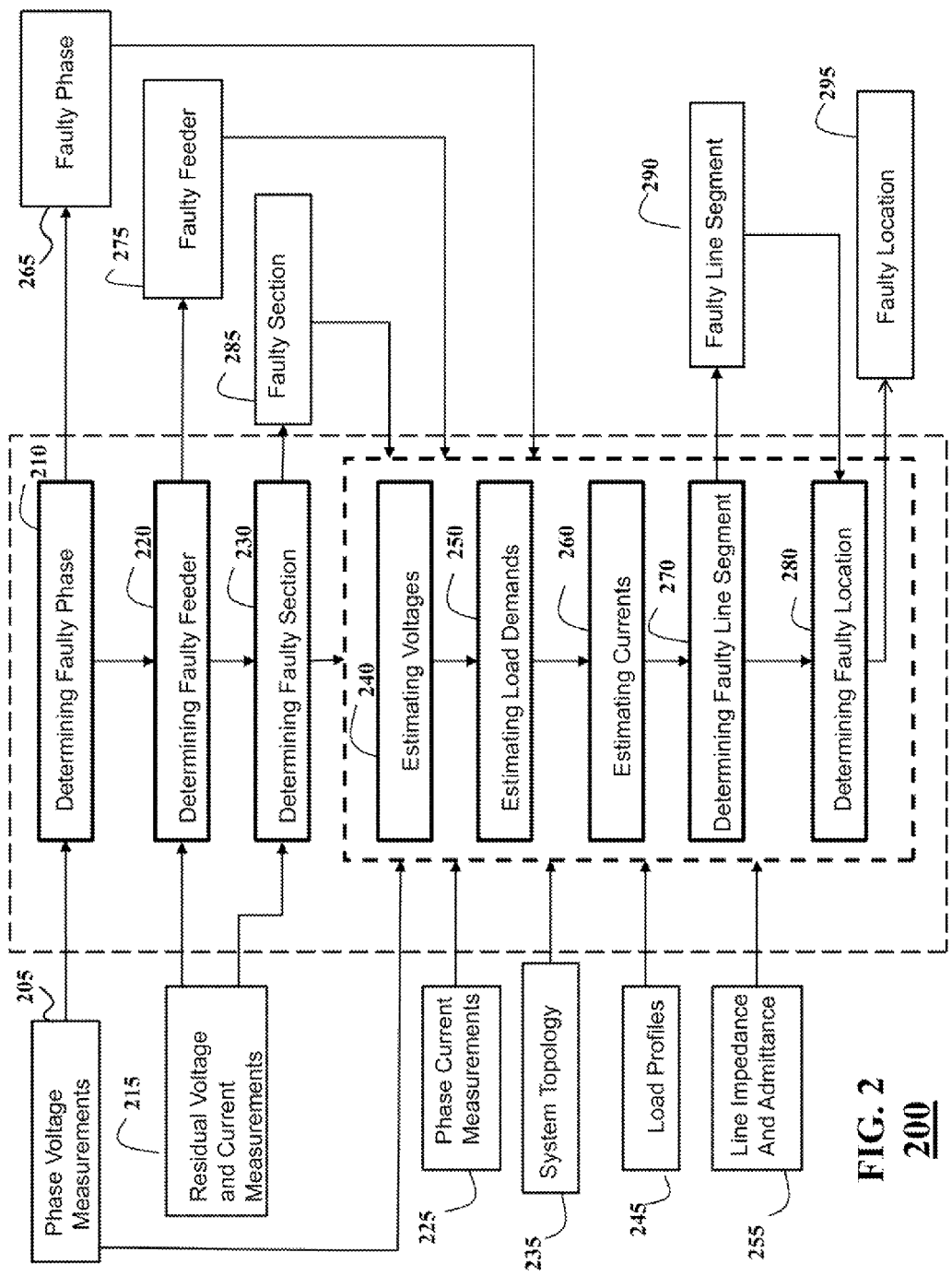
FIG. 2 is a block diagram of a method for locating the single-phase-to-ground faults of ungrounded systems according to some embodiments of invention.

FIG. 2 shows a block diagram of a method 200 for locating a sing phase-to-ground fault in an ungrounded distribution system. The power distribution system includes a set of feeders connected to a substation. Each feeder includes a set of loads connected by line segments and each line segment is defined by a pair of buses. In response to detecting the fault, the faulty phase 265 is determined 210 based on the phase voltage measurements 205. For example, the faulty phase can be determined based on comparison of phase-to-ground voltages measured at roots of each feeder in the set of feeders with lower and upper thresholds.

Then, the possible faulty area is determined for a specific feeder 275, and a specific feeder section 285, 220 and 230 based on the residual voltage and current measurements 215. For example, one embodiment compares, in response to detecting the fault, a difference between an angle of a voltage and an angle of a current measured at a root of each feeder from the set of feeders to determine a faulty feeder having the limit. Similarly, the faulty section having the fault can be determined by comparing a difference between an angle of a voltage and an angle of a current measured at boundaries of each section of the faulty feeder.

After determining the faulty feeder section, the voltages, load demands, and currents of faulty feeder section can be determined, 240, 250 and 260 using the phase voltage measurements 205, phase current measurements 225, system topology 235, load profiles for individual loads 245, and line impedance and admittance models 255. Based on those estimation results, the fault location is further limited, to one or several specific line segments 290, e.g., using line impedance and admittance models 255.

For example, some embodiments test 270 each line segment of the faulty section for a change of a sign of a voltage on the faulty phase to determine a faulty line segment. Specifically, one embodiment determines the faulty line segment by testing sequentially, starting from an upstream line segment, and the change of the sign of the voltages at the terminal buses of line segments. The line segment having the sign changed is the faulty line segment. For each possible faulty line segment 290, a possible faulty location 295 is ultimately determined 280 based on values of the phase-to-ground voltage on the faulty phase.

The measurements used by some embodiments are the steady-state power frequency components of voltage and current measurements. Each measurement can be described by a magnitude, and a phase angle. If the instantaneous waveforms are provided instead of steady-state values at power frequency, then a least-square regression method can be applied to extract the required power frequency components from the instantaneous voltage and current measurements. The measurements extracted from the measuring units of a breaker or switch with sensor include the currents flowing downstream on phase a, b and c, $I_{ps,a}$, $I_{ps,b}$ and $I_{ps,c}$, and the phase-to-ground voltages on phase a, b and c, $V_{p,a}$, $V_{p,b}$ and $V_{p,c}$, where bus p and s are the terminal buses of the breaker or switch, and bus p is upstream to bus s.

For example, fear the breaker 111, the measurements can include three-phase voltages measured at the upstream bus 103, and three-phase currents flowing through the breaker from an upstream bus 103 towards a downstream bus 105. If phase-to-ground voltages are not provided, then the measurements for the phase-to-phase voltages and residual voltages can be used, including the magnitude and phase angle of phase-to-phase voltages between phase a and phase b, phase b and phase c, and phase c and phase a, $V_{p,ab}$, $V_{p,bc}$ and $V_{p,ca}$, and the magnitude and phase angle of the residual voltage $V_p^{Res}$.

The phase-to-ground voltages can be derived from the measured phase-to-phase and residual voltages according to:

$$V_{p,a} = \frac{V_{p,ab} - V_{p,ca} + V_p^{Res}}{3}, \tag{1}$$

$$V_{p,b} = \frac{V_{p,bc} - V_{p,ab} + V_p^{Res}}{3}, \text{ and} \tag{2}$$

$$V_{p,c} = \frac{V_{p,ca} - V_{p,bc} + V_p^{Res}}{3}. \tag{3}$$

The magnitude and phase angle of the residual current, $I_{ps}^{Res}$, are also used by some embodiments.

The relationship between phase based measurements and residual based measurements include $$V_p^{Res} = V_{p,a} + V_{p,b} + V_{p,c}, \text{ and} \tag{4}$$

$$I_{ps}^{Res} = I_{ps,a} + I_{ps,b} + I_{ps,c}. \tag{5}$$

The residual power for a breaker or switch between bus p and s can be determined based on the residual voltage and residual current on the device according to $$S_{ps}^{Res} = V_p^{Res} I_{ps}^{Res*}, \tag{6}$$

where $S_{ps}^{Res}$ is the residual power at the switch/breaker between an upstream bus p and a downstream bus s, and $I_{ps}^{Res*}$ is the conjugate of residual current $I_{ps}^{Res}$.

The residual power $S_{ps}^{Res}$ can be decomposed into a real component, active residual power $P_{ps}^{Res}$, and an imaginary component, reactive residual power $Q_{ps}^{Res}$.

Accordingly, an active power factor of residual power $pf_{ps}^{Res}$, and a reactive power factor of residual power can be determined according to:

$$pf_{ps}^{Res} = P_{ps}^{Res} / |S_{ps}^{Res}|, \text{ and} \tag{7}$$

$$qf_{ps}^{Res} = Q_{ps}^{Res} / |S_{ps}^{Res}|. \tag{8}$$

The active power factor, and reactive power factor of residual power can also be determined as the cosine, and sine of the phase angle difference between the residual voltage and residual current:

$$pf_{ps}^{Res} = \cos(\angle V_p^{Res} - \angle I_{ps}^{Res}), \text{ and} \tag{9}$$

$$qf_{ps}^{Res} = \sin(\angle V_p^{Res} - \angle I_{ps}^{Res}). \tag{10}$$

Faulty Phase, Feeder and Fault Section Determination

Due to unintentional neutral groundings in ungrounded power distribution systems, the currents contributed from single-phase-to-ground faults are small, such that determining a fault phase based on phase current measurements can require precise measurements, which can be difficult in some situations. Some embodiments avoid such requirements of the precise measurements by determining the faulty phase based on the measured phase-to-ground voltages during the fault.

During a normal operation of the power distribution systems, the three phase-to-ground voltages are substantially balanced, e.g., the normalized magnitudes of voltages are close to 1.0 per unit. When a bolted single-phase-to-ground fault occurs at a feeder, the phase-to-ground voltage of the faulty phase of the faulty feeder, and adjacent feeders that connected to the same transformer instantaneously drops to a small value close to 0.0. Due to the ungrounded connection of the transformer, the substation maintains the value of the phase-to-phase voltage. Thus, the phase-to-ground voltages of the other two operational phases with no fault instantaneously increase to values close to 1.73 times of its normal operational value.

Accordingly, some embodiments determine the faulty phase based on comparison of phase-to-ground voltages measured at roots of each feeder in the set of feeders with lower and upper thresholds. The phase-to-ground voltages measured at the substation, i.e., the upstream bus of feeder breakers are used to determine the faulty phase for a single-phase-ground fault.

For example, one embodiment determines the phase x as faulty phase, if the following conditions are met:

$$|V_{p,x}| \leq \underline{V} x \in \{a,b,c\}, \tag{11}$$

$$|V_{p,y}| \geq \overline{V} y \in \{a,b,c\}, y \neq x \tag{12}$$

wherein $V_{p,x}$ and $V_{p,y}$ are the magnitudes of voltages measured at bus p on the phase x and y respectively, and $\underline{V}$ and $\overline{V}$ are the lower and upper thresholds of voltage magnitude used for abnormal voltage determination. For example, $\underline{V}$ and $\overline{V}$ can be set as 0.30 per unit, and 1.40 per unit.

After the faulty phase is determined, the faulty feeder, and faulty feeder section can be determined by examining a reactive power factor of residual powers determined by residual voltage and residual current measurements. Ignoring the asymmetry of distribution power lines, the residual currents of an ungrounded distribution system are mainly contributed from the phase-to-ground capacities of un-faulty phases of the faulty and un-faulty feeders, and the residual powers are dominated by reactive powers. Since the reactive power factor of residual power is defined as the ratio of reactive residual power over the apparent residual power, the magnitude of reactive power factor for the residual power is close to 1.0.

When a bolted single-phase-to-ground fault occurs in a feeder, the residual voltage rises to a value close to three times of normal phase-to-ground voltage of faulty phase. The direction of residual currents, at a device downstream to the faulty location, is flowing toward the substation, so the residual voltage is leading the residual current by about 90 degree, and the reactive power factor of residual power is close to 1.0. The direction of residual current at a device upstream to the fault is flowing toward the faulty location and away from the substation, so the residual voltage is lagging the residual current by about 90 degree, and the reactive power factor is close to −1.0.

Taken the single-phase-to-ground fault 104 in FIG. 1 as example, the fault is within the feeder section 115 of feeder 110. Based on the topology of the feeder, breaker 111 and switch 114 of feeder 110 are upstream to the fault location, and switch 117 is downstream to the fault location. The residual currents of breaker 111 and switch 114 flow towards the faulty location as shown as the directions by the hollow arrows 113 and 116. The residual current of switch 117 flows towards the substation, as shown by the direction of hollow arrow 119. Similarly, the breakers and switches of feeder 120 and 130 are upstream to the faulty location, so the flow directions of residual currents through those devices are towards the substation, as shown by the hollow arrows 123, 126, 129, 133, 136 and 139 in the FIG. 1.

Given the residual voltage and current measurements at a measuring device, the fault is located downstream, or upstream to the measuring device can be determined by checking the reactive power factors of residual powers. A single-phase-to-ground fault can be determined to be located downstream to the measuring device between an upstream bus p and a downstream bus s, if the following condition is satisfied:

$$qf_{ps}^{Res} > \underline{qf}, \tag{13}$$

wherein $\underline{qf}$ is a pre-determined lower threshold of reactive power factor according to the ratio of sucesptance components over total admittances of typical conductors used in the distribution systems. For example, in one embodiment, $\underline{qf}$ is 0.9.

Similarly, a single-phase-to-ground fault is upstream to the measuring device between an upstream bus p and a downstream bus s, when the following condition is satisfied:

$$qf_{ps}^{Res} < -\underline{qf}. \tag{14}$$

For a substation with multiple feeders, the measurements at the feeder breaker of each feeder are used to determine the faulty feeder. For any feeder, if the measurements at its feeder breaker satisfied the conditions described in Equation (13), then the fault is in the feeder. Otherwise, the fault is not in the feeder. If the substation only includes one feeder, then the residual current at the feeder breaker is close to zero, so the Equation (13) is not applied, and the Equations (11) and (12) for faulty phase determination are used instead. If Equation (11) and Equation (12) are satisfied, then the feeder has a single-phase-to-ground faults, otherwise, there is no fault in the feeder.

Taking FIG. 1 as example, if the reactive power factor of residual powers is close to 1.0 at the breaker 111, and −1.0 at breaker 121 and breaker 131, then the fault is not in feeders 120 and 130, but in the feeder 110. Accordingly, some embodiments determine the faulty feeder by comparing reactive power factors of residual powers at a root of a feeder. For example, the reactive power factors can be compared with each other or with an upper and a lower threshold using a sine of angular difference between a residual voltage and a residual current measured at the root of the feeder.

After the faulty feeder is determined, the faulty section can also be determined by checking the reactive power factor of residual power for each measuring device along the faulty feeder. A feeder section is determined to be a faulty one when the reactive power factor of residual power at its importing measuring device im satisfies the following condition:

$$qf_{im}^{Res} > \underline{qf}, \tag{15}$$

and the reactive power factor of residual power at one of its exporting measuring device satisfies the following condition:

$$qf_{ex}^{Res} < -\underline{qf} \tag{16}$$

If the magnitude of residual current at the importing measuring device is close to be zero, only the exporting measuring devices are used to determine whether there is a fault within the section by using Equation (16). For example, for a single-feeder substation, the residual current measured at the feeder breaker is close to zero, so only the measurements at the exporting measuring devices are used. If the feeder section has only one importing measuring device, then a faulty section is determined by using the measurements at the importing measuring device using Equation (15).

In the example of FIG. 1, if the reactive power factors are close to 1.0 at the breaker 111 and switch 114, but −1.0 at the switch 117, then the fault is determined to be within the feeder section between switch 114 and switch 117, that is feeder section 115 of feeder 110. Similarly to the determining the faulty feeder, some embodiments determine the faulty section by comparing reactive power factors of residual powers at boundaries of a feeder section, e.g., with an upper and a lower thresholds using a sine of an angular difference between a residual voltage and a residual current measured at the boundaries of the feeder section.

Determining Voltage Distribution of Faulty Feeder

To locate the fault spot, some embodiments determine the voltage and current distribution of the faulty feeder, or faulty section during the fault. In one embodiment, the voltages of a feeder section are determined based on the phase voltage measurements at the importing and exporting measuring devices of the section.

Figure 3:
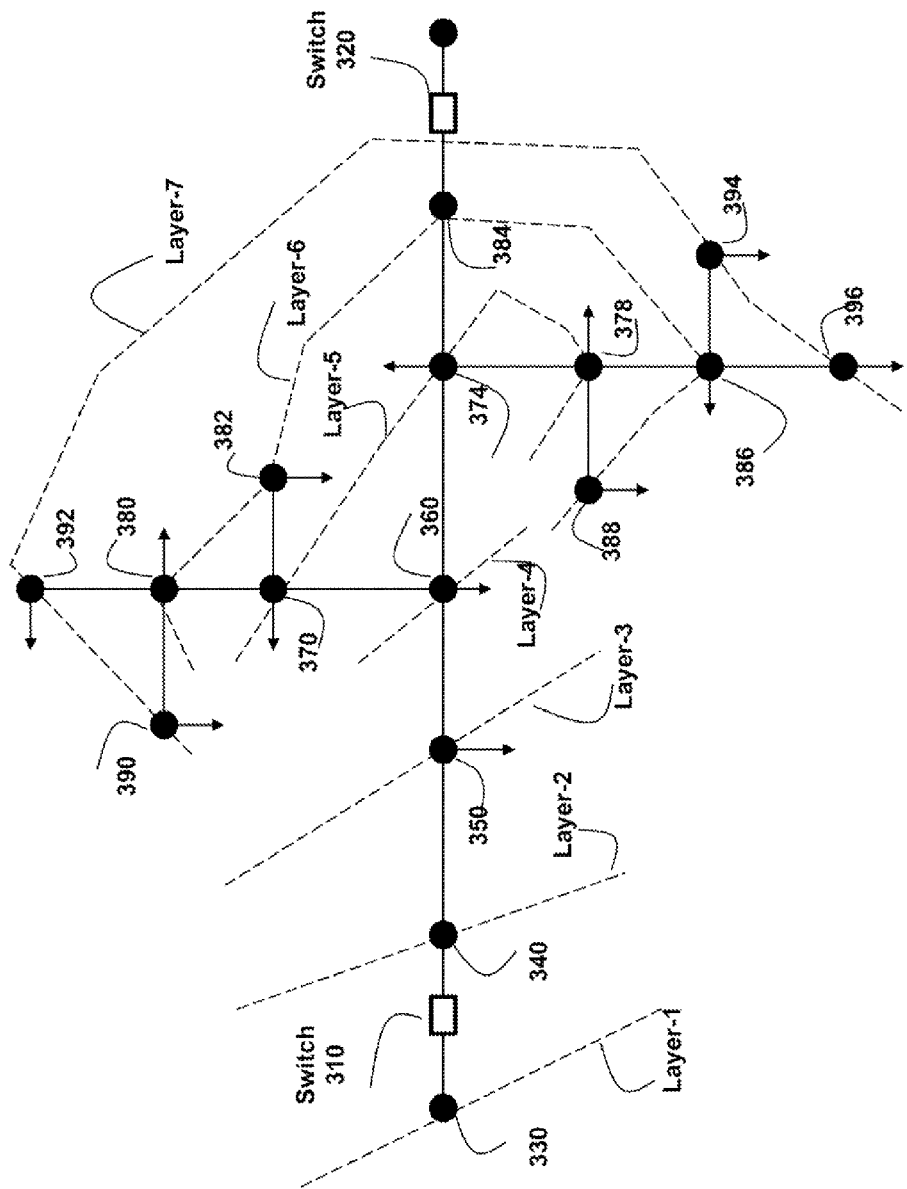
FIG. 3 is a schematic of a feeder section with a breaker or a switch with sensor as an importing measuring device, and multiple switches with sensors as exporting measuring devices.
Figure 4:
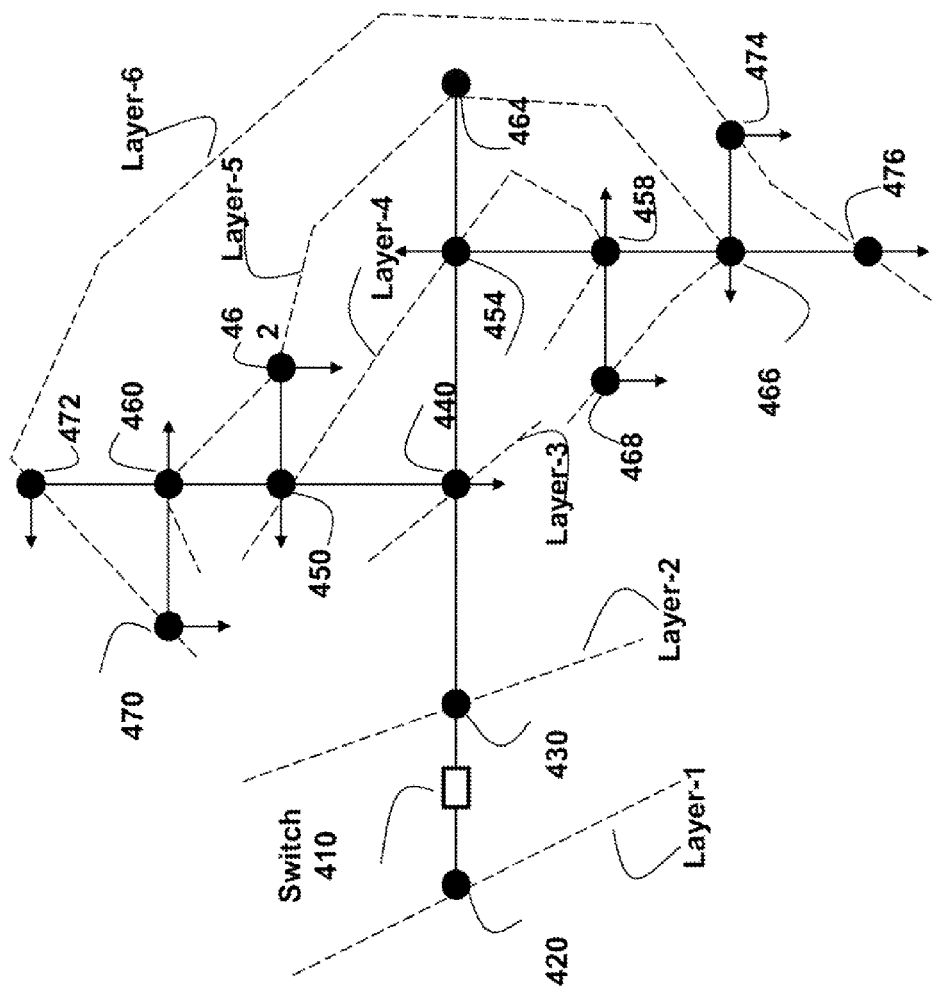
FIG. 4 is a schematic of a feeder section with a breaker or a switch with sensor as an importing measuring device.

FIG. 3 and FIG. 4 show two examples of feeder sections with different measuring conditions. FIG. 3 is a schematic of a feeder section 300 that has multiple measuring devices at its boundaries. The feeder section 300 has one importing measuring device at switch 310, and one exporting measuring device at switch 320. FIG. 4 is a schematic of a feeder section 400 that has only one measuring device, importing measuring device at switch 410.

For a feeder section with multiple measuring devices, the connectivity path between each pair of the importing measuring device and at least one of the exporting measuring devices is determined. For any bus residing in the path, the phase-to-ground voltages of the bus are determined based distances from the bus to two measuring, devices and available voltage measurements at the two measuring devices.

The phase-to-ground voltage of bus p can be determined according to:

$$V_p = \frac{d_{p\text{-}ex}}{d_{im\text{-}p} + d_{p\text{-}ex}} V_{im} + \frac{d_{im\text{-}p}}{d_{im\text{-}p} + d_{p\text{-}ex}} V_{ex}, \quad (17)$$

where $V_p$ is the vector of determined phase-to-ground voltages of bus p, $V_{im}$ and $V_{ex}$ are the vectors of phase-to-ground voltages measured at the importing measuring device im and exporting measuring device ex, $d_{im\text{-}p}$ and $d_{p\text{-}ex}$ are the sum of length of line segments residing at the path between the upstream bus of importing device im to bus p, and bus p to the upstream bus of exporting device ex respectively.

If there are multiple exporting measuring devices, and common buses between different paths, then the voltages of those common buses are set as an average of determined voltages for all paths according to $$V_p = \frac{1}{m} \sum_{i=1}^{m} \left( \frac{d_{p\text{-}ex_i}}{d_{im\text{-}p} + d_{p\text{-}ex_i}} V_{im} + \frac{d_{im\text{-}p}}{d_{im\text{-}p} + d_{p\text{-}ex_i}} V_{ex_i} \right), \quad (18)$$

where m is the total number of paths that pass through bus p, $ex_i$ is the exporting measuring device of the i-th path, $V_{ex_i}$ is the measured voltage of exporting measuring device $ex_i$, and $d_{p\text{-}ex_i}$ is the sum of length of line segments residing at the path between bus p to the upstream bus of exporting measuring device $ex_i$.

A voltage of a bus not directly located on the path between the measuring devices, but fed from one of buses in that path, can be determined as the voltage of the feeding bus on the path according to:

$$V_s = V_p, \quad (19)$$

where bus s is a bus not in the paths, bus p is a bus in the paths, $V_s$ is vector of the determined phase-to-ground voltages of bus s.

The feeder section shown in FIG. 3 has one importing measuring device at the bus 330, and one exporting measuring device at bus 384. All buses on the path between the importing and exporting measuring devices, such as buses 340, 350, 360 and 374 are determined based on corresponding distances to the buses 330 and 384 and measured voltages at the buses 330 and 384 according to Equation (17).

The voltages of the buses downstream bus 360 and fed by the bus 360, including buses 370, 380, 382, 390, 392 are set as the same as the determined voltage of bus 360. The voltages of all buses downstream bus 374, including buses 378, 386, 388, 394, and 396 are set as the same as the determined voltage of bus 374.

For a feeder section with only one importing measuring device, buses within the section are set as the measured voltages at the importing measuring device. Taking FIG. 4 as example, the feeder section has only one importing measuring device at bus 420, the voltages of all buses in the section are set as the same as the voltages measured at bus 420.

Estimating Power Consumption of the Loads of the Faulty Feeder Section

The currents flowing in the faulty feeder section are contributed from individual loads of the feeder and from the short circuit fault and shunt capacitances of distribution lines. In some embodiments, the power demands of individual loads are not measured, but determined based on the available measurements at measuring devices and load profiles for each individual load.

Figure 5:
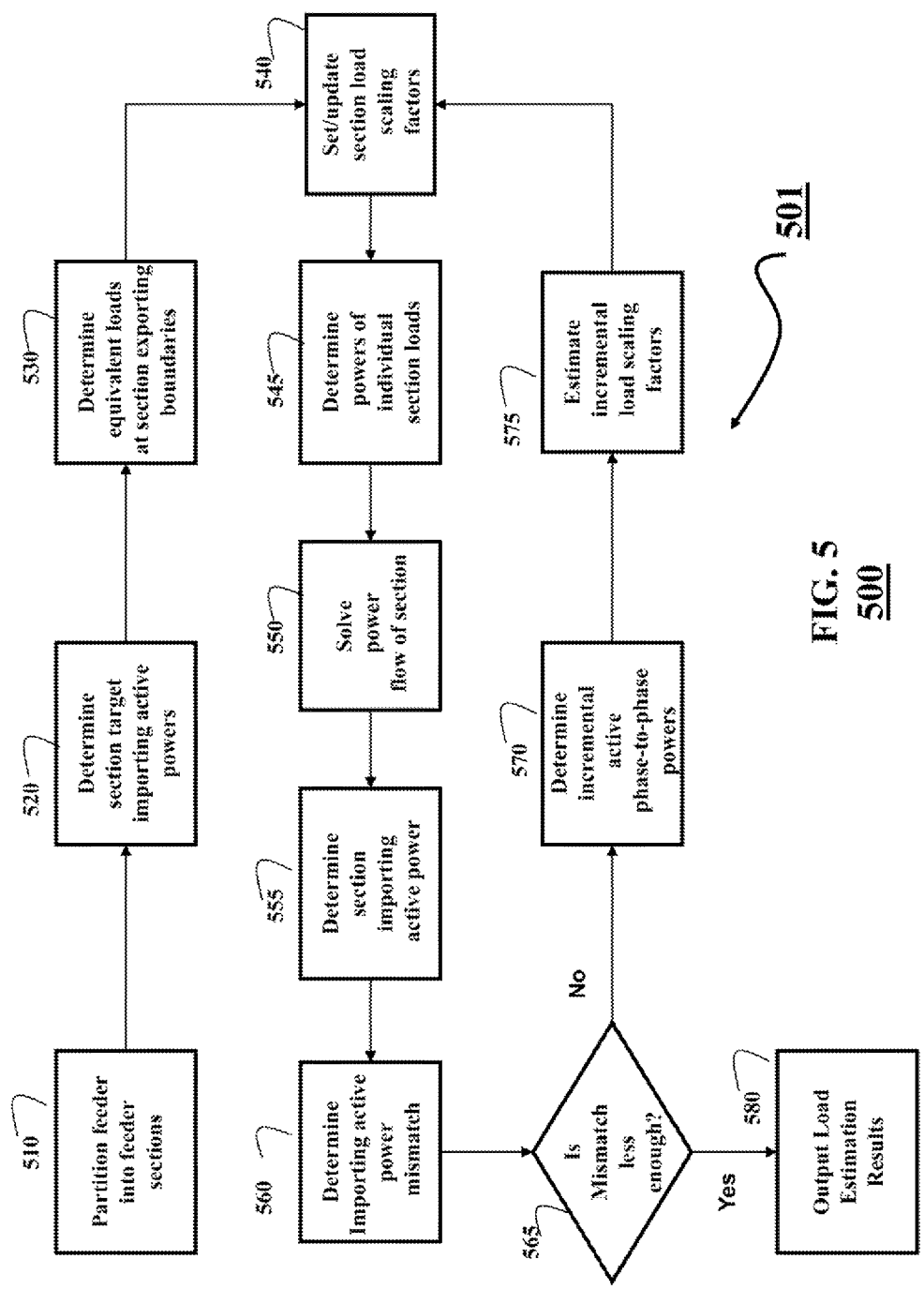
FIG. 5 is a block, diagram of a method for determining loads of ungrounded systems according to some embodiments of invention.

FIG. 5 shows a method 500 for determining loads of ungrounded systems according to some embodiments of invention. The steps of the method can be implemented by a processor 501.

In step 510, a feeder in an ungrounded distribution system is partitioned into a set of feeder sections according to the measuring devices along the feeder. The loads of each feeder section are determined independently.

In step 520, a set of target active power at the importing device are determined, per phase based on the measurements at the device. If the ungrounded distribution system has a fault, then in one embodiment, the impacts of the fault are removed from the measurements.

In step 530, the powers of equivalent loads at the exporting devices that supplied powers to the downstream sections are determined based on the measurements at the exporting measuring devices of the feeder section.

In step 540, the scaling factors for DELTA-connected loads for the feeder section are initialized for a first iteration, and updated with incremental changes determined in step 575.

In step 545, the powers of each individual load are determined as a product of load scaling factors for the section, and base powers defined by load profiles of the individual load.

In step 550, a power flow is solved for the feeder section by assigning the upstream bus of importing device of the section as a constant voltage bus, the upstream buses of exporting devices and buses with loads as constant power buses. The voltages of upstream bus of importing measuring device are set based on the voltage measurements at the importing device.

In step 555, a set of active powers at the importing device for each phase are determined based on the solution of the power flow determined in step 550.

In step 560, a set of active power mismatches at the importing device for each phase are determined as a difference between the target active powers determined, in step 520, and active powers determined in step 555.

In step 565 the active power mismatches are compared with a predetermined threshold. If the mismatch is less than the threshold or a predetermined number of iterations are reached, the method outputs the results 580. Otherwise, the method performs steps 570 and 575.

In step 570, a set of incremental active phase-to-phase powers are determined based on the set of active power mismatches per phase determined in step 560 through equivalent resistance transformation or equivalent current transformation.

In step 575, a set of incremental scaling factors for DELTA-connected loads in the feeder section is determined based on the incremental phase-to-phase powers determined in step 570, and the load profiles for the loads in the section.

Step 580 outputs the power consumption of the loads in the feeder section.

The loads in the feeder section can include fixed loads and scalable loads. The fixed loads refer to the equivalent loads consumed by downstream feeder sections connected to the feeder section through the exporting measuring devices. For an exporting measuring device, the equivalent WYE-connected power demands can be determined using the phase-to-ground voltage and phase current measurements at the measuring device:

$$S_{ex_i,x} = V_{ex_i,x} I^*_{ex_i,x} \; x \in \{a,b,c\} \quad (20)$$

were $S_{ex_i,x}$ is the equivalent power consumption at measuring device $ex_i$ on phase x, $V_{ex_i,x}$ and $I_{ex_i,x}$ are the voltage and current of phase x measured at the measuring device $ex_i$.

The scalable loads can refer to individual loads in the feeder section, which can be DELTA-connected. The power consumptions of individual loads can be defined as:

$$S_{p,xy} = \alpha_{p,xy} S_{p,xy}^{base} \; xy \in \{ab,bc,ca\} \quad (21)$$

where $S_{p,xy}^{base}$ is the initial power consumption given by load profile for the time interval of interest, e.g., a time interval for fault, $\alpha_{p,xy}$ is the scaling factor for a load component between phase x and phase y.

A load profile for a load is created using historical measurements of the customers' electricity use at regular intervals, typically 15 minutes or less, and provides an accurate representation of customers' usage pattern over time.

One embodiment determines the values of the vector of sealing factors $\alpha_{p-xy}$ at the moment of fault occurring for each individual loads based on available measurements. Each load is associated with a set of sealing factors. One embodiments uses a set of uniform scaling factors, such that individual loads between phase x and y use the same scaling factor $\alpha_{xy}$ to determine power consumption of the loads. Alternative embodiment determines the scaling factors based on the steady state voltage and current measurements measured before or during the fault.

Load Estimation Using Measurements Before the Fault

The scaling factors for the feeder section can be determined using the measurements at the importing and exporting measuring devices of the feeder section measured before the fault. Some embodiments determine the scaling factors iteratively. For example, the scaling factors are initialized with a set of initial values and the power demands are determined for each individual load. Then, the buses of individual loads and exporting measuring devices are treated as constant active power and reactive power buses, i.e., PQ buses. The buses of importing measuring devices are treated as a constant voltage and phase angle bus, i.e., the swing, bus.

The voltages of the swing bus are set as the measured voltages at the importing measuring device. A power flow procedure, such as a backward/forward sweep method can be used to determine the power flows of the feeder section. Based on the solved power flow results, a determined active power at the importing, measuring device is computed according to:

$$P_{im,x}^{calculated} = |V_{im,x}||I_{im,x}^{calculated}|\cos(\angle V_{im,x} - \angle I_{im,x}^{calculated}) \; \text{for} \; x \in \{a,b,c\} \quad (22)$$

where $P_{im,x}^{calculated}$ is the determined active power on phase x at the importing measuring device, $|V_{im,x}|$ and $\angle V_{im,x}$ are the magnitude and phase angle of phase-to-ground voltage on phase x measured at the importing measuring device, $|I_{im,x}^{calculated}|$ and $\angle I_{im,x}^{calculated}$ are the magnitude and phase angle of determined phase current on phase x through the importing measuring device into the feeder section.

Some embodiments check against a target active power determined the voltage and current measurements at the importing measuring device:

$$P_{im,x} = |V_{im,x}||I_{im,x}|\cos(\angle V_{im,x} - \angle I_{im,x}) \; x \in \{a,b,c\} \quad (23)$$

where $P_{im,x}$ is the target active power on phase x at the importing measuring device, $|I_{im,x}|$ and $\angle I_{im,x}$ are the magnitude and phase angle of phase current on phase x measured at the importing measuring device.

If the determined active powers and the target power active powers for all phases are close, then the current set of scaling factors are the final solution. For example, one embodiment compares the difference between active powers and the target power with a threshold according to $$|P_{im,x}^{calculated} - P_{im,x}| \leq \epsilon \; x \in \{a,b,c\} \quad (24)$$

An example of the threshold $\epsilon$ is 0.00001. If the condition expressed in Equation (24) is not met, the scaling factors are adjusted iteratively until the difference is below threshold.

Various embodiments use at least two different methods to adjust the scaling factors of the study feeder section. One method is the incremental equivalent resistance based approach, and the other method is the incremental current based approach.

Adjusting Scaling Factors Based on Incremental Equivalent Resistances

One embodiment uses the active power mismatch at importing device to determine equivalent WYE-connected incremental resistances for all three phase at the importing device, and then convert the WYE-connected incremental resistances into DELTA-connected incremental resistances, and based on those DELTA-connected incremental resistances, determines set of incremental phase-to-phase active powers. The required incremental scaling factors are determined based on the incremental phase-to-phase active powers and values provided by the load profiles.

Figure 6:
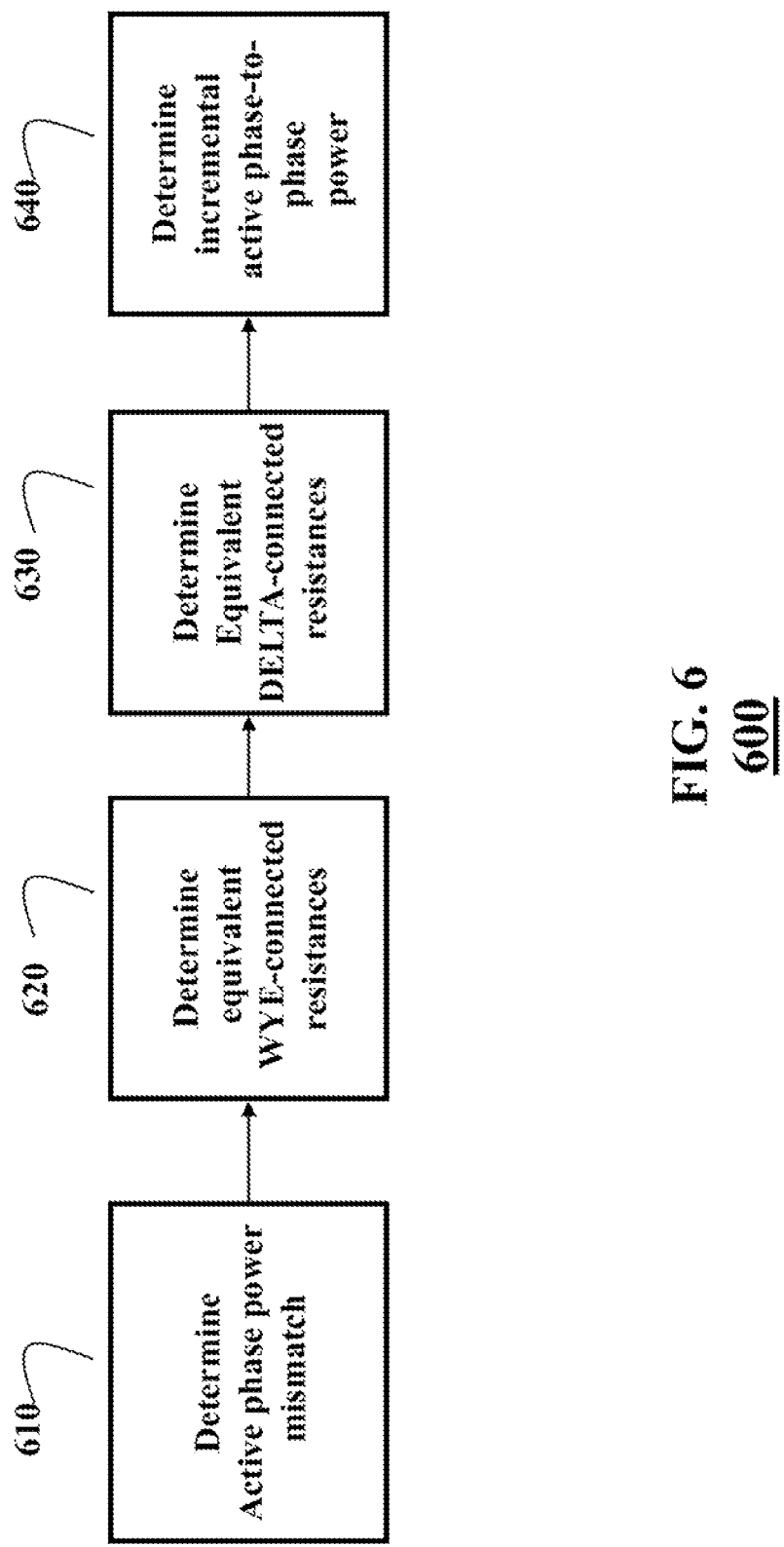
FIG. 6 is a block diagram of a method for determining incremental scaling factors for DELTA-connected loads based on the active phase power mismatches at the importing measuring device of the feeder section through equivalent resistance transformation according to some embodiments of invention.

FIG. 6 shows a block diagram of a method for transforming phase active power mismatches through resistance conversion to determined phase-to-phase difference between: the active and target active powers according so one embodiment of the invention. For example, this embodiment can use the incremental equivalent resistance based approach for determining incremental phase-to-phase active powers based on active phase power mismatches. Step 610 determines the active power mismatch for each phase at the importing measuring device. In step 620, a set of equivalent WYE-connected resistances are determined based on the active power mismatches determined in step 610, and phase-to-ground voltages measured at the importing device. In step 630, using WYE-DELTA transformation of resistances, a set of equivalent DELTA-connected resistances are determined, and step 640 determines the incremental active phase-to-phase powers based on the equivalent resistances given by step 630, and the phase-to-ground voltages measured at the importing device.

In some embodiments, the active power mismatches of all phases at the importing measuring device are determines according to $$\Delta P_{im,x} = P_{im,x} - P_{im,x}^{calculated} \text{ for } x \in \{a,b,c\} \quad (25)$$

where $\Delta P_{im,x}$ the active power mismatch of phase x at the importing measuring device. The equivalent WYE-connected resistances can be determined as:

$$\Delta R_{im,x} = |V_{im,x}|^2 / \Delta P_{im,x}, x \in \{a,b,c\} \quad (26)$$

where $\Delta R_{im,x}$ is the equivalent resistance for phase x at the importing device. Using the WYE-DELTA transformation of resistances, a set of DELTA-connected equivalent resistances can be determined according to:

$$\Delta R_{im,ab} = \frac{\Delta R_{im,a}\Delta R_{im,b} + \Delta R_{im,b}\Delta R_{im,c} + \Delta R_{im,c}\Delta R_{im,a}}{\Delta R_{im,c}}, \quad (27)$$

$$\Delta R_{im,bc} = \frac{\Delta R_{im,a}\Delta R_{im,b} + \Delta R_{im,b}\Delta R_{im,c} + \Delta R_{im,c}\Delta R_{im,a}}{\Delta R_{im,a}}, \quad (28)$$

$$\Delta R_{im,ca} = \frac{\Delta R_{im,a}\Delta R_{im,b} + \Delta R_{im,b}\Delta R_{im,c} + \Delta R_{im,c}\Delta R_{im,a}}{\Delta R_{im,b}}, \text{ and} \quad (29)$$

where $\Delta R_{im,ab}$, $\Delta R_{im,bc}$ and $\Delta R_{im,ca}$ the equivalent DELTA-connected resistances between phase a and h, h and c, c and a respectively. Based on these DELTA-connected resistances, the corresponding incremental active phase-to-phase powers are determined as:

$$\Delta P_{im,xy} = \frac{|V_{im,xy}|^2}{\Delta R_{im,xy}}, x \in \{a, b, c\} \quad (30)$$

where $\Delta P_{im,xy}$ are the required incremental active powers between phase x to phase y, and $|V_{im,xy}|$ are the magnitude of phase-to-phase voltages between phase x to phase y.

Combing Eq. (26)-(30), the incremental phase active powers are converted into incremental phase-to-phase active powers according to:

$$\Delta P_{im,xy} = \frac{|V_{im,xy}|^2|V_{im,z}|^2}{\Delta P_{im,z}\sum_{st \in \{ab,bc,ca\}}(|V_{im,s}|^2|V_{im,t}|^2/\Delta P_{im,s}/\Delta P_{im,t})}, \quad (31)$$

$$(xy, z) \in \{(ab, c), (bc, a), (ca, b)\}$$

where $|V_{im,s}|$, $|V_{im,t}|$ and $|V_{im,z}|$ are the magnitude of phase-to-ground voltage at phase s, phase t and phase z respectively, $\Delta P_{im,s}$ $\Delta P_{im,t}$ and $\Delta P_{im,z}$ are the active power mismatch at phase s, phase t and phase z, and phase z is different than phase x and y.

The required incremental scale factors can be determined according to:

$$\Delta \alpha_{xy} = \frac{\Delta P_{im,xy}}{\sum_{p \in LD} P_{p,xy}^{base}} xy \in \{ab, bc, ca\} \quad (32)$$

where $\Delta \alpha_{xy}$ is the required incremental scale factors for loads between phase x and y, $P_{p,xy}^{base}$ is the initial active power of load connected to bus p between phase x and y provided by the load profiles, LD is the set of load buses in the feeder section.

Adjusting Scaling Factors Based on Incremental Equivalent Currents

Another embodiment uses the solution of the power flow and current measurements to determine current mismatches at the importing measuring device for each phase, and determine incremental phase-to-phase currents based on the current mismatch. Those incremental currents are used to determine a set of incremental phase-to-phase active powers. The incremental scaling factors are finally determined using the incremental phase-to-phase active powers and base values provided by the load profiles.

Figure 7:
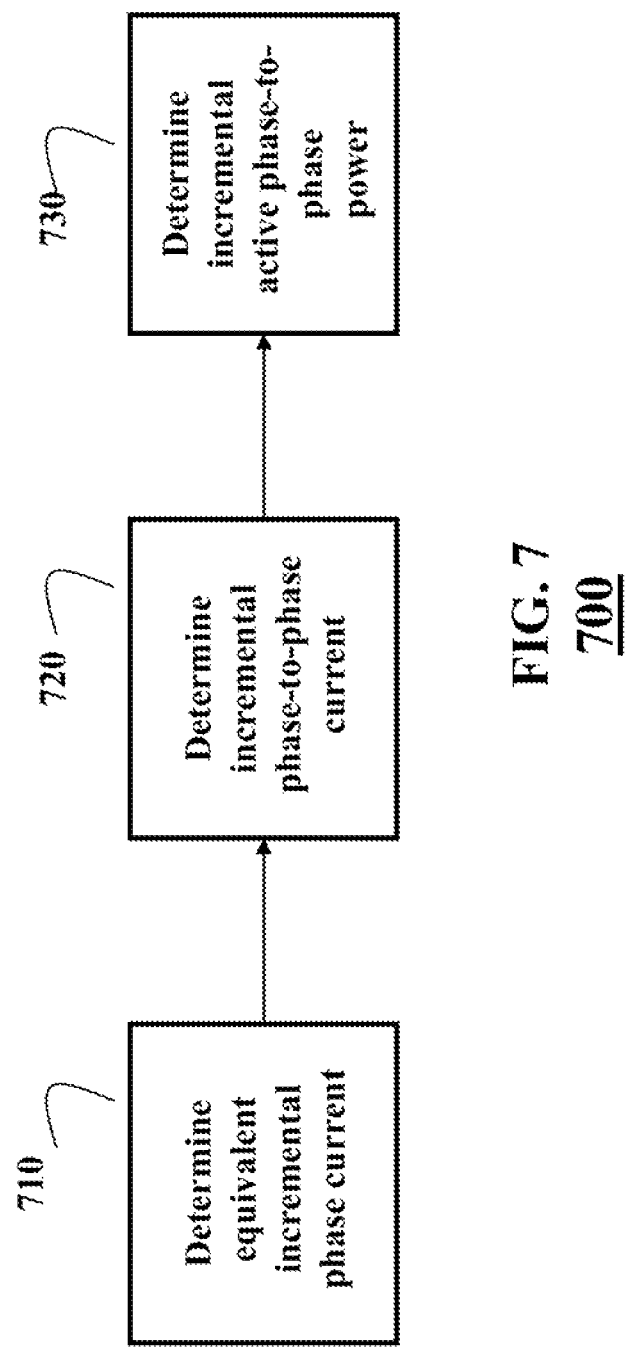
FIG. 7 is a block diagram of a method for determining incremental scaling factors for DELTA-connected loads based on the phase current mismatches at the importing measuring device of the section through equivalent current transformation according to some embodiments of invention.

FIG. 7 shows a block diagram of an incremental equivalent current based method for determining incremental phase-to-phase active powers based on current mismatches, according another embodiment. This embodiment uses the solution of the power flow and current measurements to determine current mismatches at the importing measuring device for each phase, and determine incremental phase-to-phase currents based on the current mismatch. Those incremental currents are used to determine a set of incremental phase-to-phase active powers. The incremental scaling factors are finally determined using the incremental phase-to-phase active powers and base values provided by the load profiles.

Specifically, in step 710, the method determines the current mismatch for each phase at the importing measuring device. In some embodiments, the current mismatch for each phase at the importing device is determined according to $$\Delta I_{im,x} = I_{im,x} - I_{im,x}^{calculated} x \in \{a,b,c\}, \quad (33)$$

wherein $\Delta I_{im,x}$ is the mismatch of current at the phase x at the importing device, a target current $I_{im,x}$ is measured at the importing device, and the current $I_{im,x}^{calculated}$ is determined by the power flow.

In step 720, a set of phase-to-phase currents are determined based on the phase current mismatches. For example, the incremental phase-to-phase currents can be determined according to $$\Delta I_{im,xy} = \frac{\Delta I_{im,x} - \Delta I_{im,y}}{2} \quad xy \in \{ab, bc, ca\}, \quad (34)$$

wherein $\Delta I_{im,xy}$ is the incremental current between a phase x and a phase y at the importing device In step 730, the incremental active phase-to-phase powers are determined based on the incremental phase-to-phase currents and phase-to-phase voltages measured at the importing device. For example, the incremental active phase-to-phase power can be determined according to $$\Delta P_{im,xy} = |V_{im,xy}||\Delta I_{im,xy}|\cos[\angle V_{im,xy} - \angle(\Delta I_{im,xy})], xy \in \{ab,bc,ca\}, \quad (35)$$

wherein $\Delta P_{im,xy}$ the incremental active phase-to-phase power, $|\Delta I_{im,xy}|$ and $\angle(\Delta I_{im,xy})$ are a magnitude and a phase angle of incremental phase-to-phase current between the phase x and the phase v at the importing device. Next, Equation (32) can be used to determine the required incremental scaling factors.

In one embodiment, the iterative procedure for determining the scale factors of the feeder section with measurements before the fault can be summaries as Step-1: set all scale factors as 1.0, and determine the loads of faulty section using Equations (20) and (21).

Step-2: based on the voltage measured at the importing measuring device of the feeder section, and determined loads in step-1, solve the power flows of the feeder section using a power flow calculation method, such as backward/forward sweep method.

Step-3: determine the mismatch of target and determined active powers for each phase at the importing measuring device using Equations (23) and (22).

Step-4: check whether the mismatch of active powers is less than a given threshold using Equations (24). If yes, the final scale factors are found. Otherwise, go to step-5.

Step-5: determine the required incremental sealing factors using incremental equivalent resistance based method with Equations (25), (31), and (32), or incremental equivalent current based method with Equations (33), (34), (35) and (32).

Step-6: Update the scale factors with the incremental ones, and go back to step 2 for the new iteration.

Determining Loads of a Feeder Section Using Measurements During the Fault

The scaling factors for the feeder section can also be iteratively determined using the measurements during the fault by importing and exporting devices. The buses of individual loads and upstream buses of exporting measuring devices are treated as PC) buses, and the equivalent power demands of exporting devices are determined using Equation (20) with voltage and current measured during the fault. The upstream bus of importing device is treated as a swing bus, and its magnitude and a phase angle of phase-to-ground voltages are set as measured values during the fault.

As described above, the power flow analysis determines the active powers. The target active powers are determined based on the measurements at importing device. However, in this embodiment, the target active powers are determined differently, for a feeder section having a fault, and for a feeder section without a fault.

Specifically, for a feeder section without a fault, Eq. (23) is used to determine the target active powers at the importing device with the phase-to-ground voltages and phase currents measured. Accordingly, the incremental scaling factors of a feeder section without a fault can be determined by using either incremental equivalent resistance based method, or incremental equivalent current based approach.

For a feeder section having a fault, the fault: currents are flowing into the section and entered into the ground. For example, sections downstream from the faulty feeder section have no fault currents. For a faulty feeder section, the phase currents measured at the importing devices are contributed from two aspects. One aspect is the load demands used to determine the scaling factors. The other aspect is the impacts of the single-line-to-ground fault within the section that is not used for scaling factor determination. Due to the short circuit in the feeder section, the phase current at the faulty phase includes the components serving the loads downstream, and the components contributed from the shunt capacitors of the faulty feeder and adjacent un-faulty feeders that connected to the same transformer as the faulty feeder.

Considering, the impacts of short circuit in the feeder section, the target phase powers are determined differently for a faulty phase and an un-faulty phase. For the un-faulty phase x, the target active, power, is determined by directly using the voltage and current measurements during the fault using Equation (23). For a faulty phase x, the target power is determined according to:

$$P_{im,x} = |V_{im,x}||\hat{I}_{im,x}|\cos(\angle V_{im,x} - \angle \hat{I}_{im,x}), \quad (36)$$

where $\hat{I}_{im,x}$ is the determined phase current on phase x, defined as the phase current measurement with a subtraction of shunt currents resulting from a single-phase-to-ground fault:

$$\hat{I}_{im,x} = I_{im,x} - TI_{im} + I_{im}^{shunt}, \quad (37)$$

wherein $I_{im}$ is the vector of phase currents measured at the importing measuring device during the fault, T=[1 1 1], and $I_{im}^{shunt}$ is the shunt current resulting from all line segments downstream to the importing measuring device. $I_{im}^{shunt}$ is determined according to:

$$I_{im}^{shunt} = \sum_{ps \in DN_{on}} \frac{1}{2} T Y_{ps}^{sh}(V_p + V_s), \quad (38)$$

where $DN_{im}$ is the set of line segments downstream to the importing measuring device, and includes line segments within the faulty section, and all feeder sections downstream to the faulty section, bus p and bus s are two terminal buses of line segment ps, $Y_{ps}^{sh}$ is the shunt admittance matrix for a line segment between bus p and s, $V_p$ and $V_s$ are the phase-to-ground voltages of bus p and bus s.

Similarly, the phase-to-ground voltages for buses based on voltage measurements collected during the fault are determined as discussed above.

Figure 8:
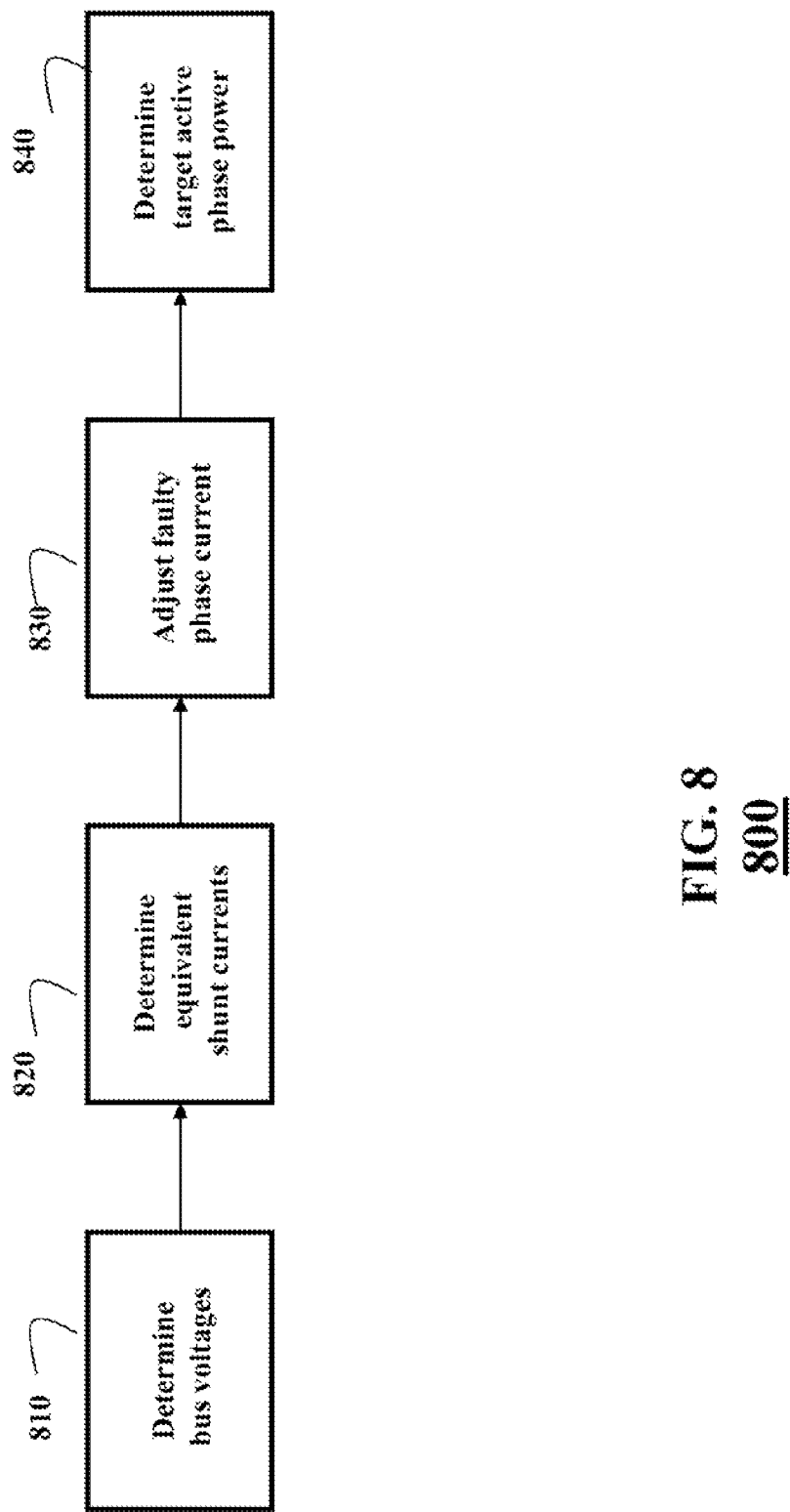
FIG. 8 is a block diagram of a method for determining target active powers of a feeder section having a fault according to some embodiments of invention.

FIG. 8 shows a block diagram of a method for determining target active powers of a feeder section having a fault. In step 810, the voltages of all buses downstream to the importing measuring device are determined based on the voltage measurements at the boundaries of the feeder section. In step 820, the shunt currents at the importing device of the faulty section are calculated based on the shunt admittances of line segments and voltages of the buses. Step 830 adjusts the faulty phase current based on the measured currents and shunt currents determined in step 820. In step 840, the target active powers are determined using Eq. (36) for a faulty phase, and Eq. (23) for a phase without the fault.

The incremental Sealing factors of the faulty feeder section can be determined by using either incremental equivalent resistance based method, or incremental equivalent current based approach.

In some embodiments using the equivalent current based method, the active current mismatches for the faulty and un-faulty phases are determined with different equations for target current. For an un-faulty phase, the measured current $I_{im,x}$ is used as target current to determine the phase current mismatch using Eq. (33). But for a faulty phase, the phase current mismatch is determined using Eq. (33) by replacing the measured current $I_{im,x}$ with $\hat{I}_{im,x}$ as target current.

The incremental phase-to-phase currents are determined based on a set of equations defined according to the faulty phase.

If the faulty phase is phase a, the incremental phase-to-phase currents are determined according to:

$$\Delta I_{im,ab} = -\Delta I_{im,b}, \tag{39}$$

$$\Delta I_{im,bc} = \frac{\Delta I_{im,b} - \Delta I_{im,c}}{2}, \text{ and} \tag{40}$$

$$\Delta I_{im,ca} = \Delta I_{im,c}. \tag{41}$$

Similarly, if the faulty phase is phase b, then the incremental phase-to-phase currents are determined according to:

$$\Delta I_{im,ab} = \Delta I_{im,a}, \tag{42}$$

$$\Delta I_{im,bc} = -\Delta I_{im,c}, \text{ and} \tag{43}$$

$$\Delta I_{im,ca} = \frac{\Delta I_{im,c} - \Delta I_{im,a}}{2}. \tag{44}$$

If the faulty phase is phase c, then the incremental phase-to-phase currents are determined according to:

$$\Delta I_{im,bc} = \frac{\Delta I_{im,a} - \Delta I_{im,b}}{2}, \tag{45}$$

$$\Delta I_{im,bc} = -\Delta I_{im,b}, \text{ and} \tag{46}$$

$$\Delta I_{im,ca} = \Delta I_{im,a}. \tag{47}$$

One embodiment uses the iterative procedure to determine the scale factors of the feeder section with the measurements during the fault can be summaries as follows:

Step-1: determine the voltage of the faulty feeder section and all feeder section downstream to the faulty section based on the voltage measurements during the fault using, Equation (17), (18), or (19), Step-2: determine the shunt currents at importing measuring device using Equation (38), and determine phase current at the faulty phase using Equation (37).

Step-3: set all scale factors as 1.0, and determine the loads of faulty section using Equation (20) and (21).

Step-4: based on the voltage measured at the importing measuring device of the feeder section, and determined loads in step-3, solve the power flows of the feeder section using a power flow calculation method, such as backward/forward sweep method.

Step-5: determine the mismatch of target active powers determined by using Equation (23) for an un-faulty phase, (36) for a faulty phase, and determined active powers determined by Equation (22).

Step-6: check whether the mismatch of active powers is less than a given threshold using Equation (24). If yes, the final scale factors are found. Otherwise, go to step-8.

Step-7: determine the required incremental scaling factors using incremental equivalent resistance based method with Equation (25), (31), and (32), or incremental equivalent current based method with Equation (33), (39-40) or (42)-(44), or (45)-(47), (35), and (32). The measured current $I_{im,x}$ is replaced with $\hat{I}_{im,x}$ as target current when using Eq. (33) to determine the phase current mismatch.

Step-8: Update the scale factors with the incremental ones, and go back to step 4 to executive an new iteration.

Estimating of Current Distribution of Faulty Feeder Section

After the voltages and load demands are determined, some embodiments determine the current distribution of the faulty feeder section. For example, one embodiment considers the currents contributed from load demands, and shunt capacitors, but ignores the impacts of the single-phase-to-ground fault. The current distribution is used to determine the currents flowing on the un-faulty line segments of the faulty feeder section.

The buses of the faulty feeder can, be grouped into several layers according to the number of devices connected between each bus and the upstream bus of importing measuring device. One embodiment uses a backward calculation method, i.e., the currents of line segments or devices connected upstream to the last layer are determined first, then moving to next layer upstream, and ending at the line segments or devices connected downstream to the first layer.

Figure 9:
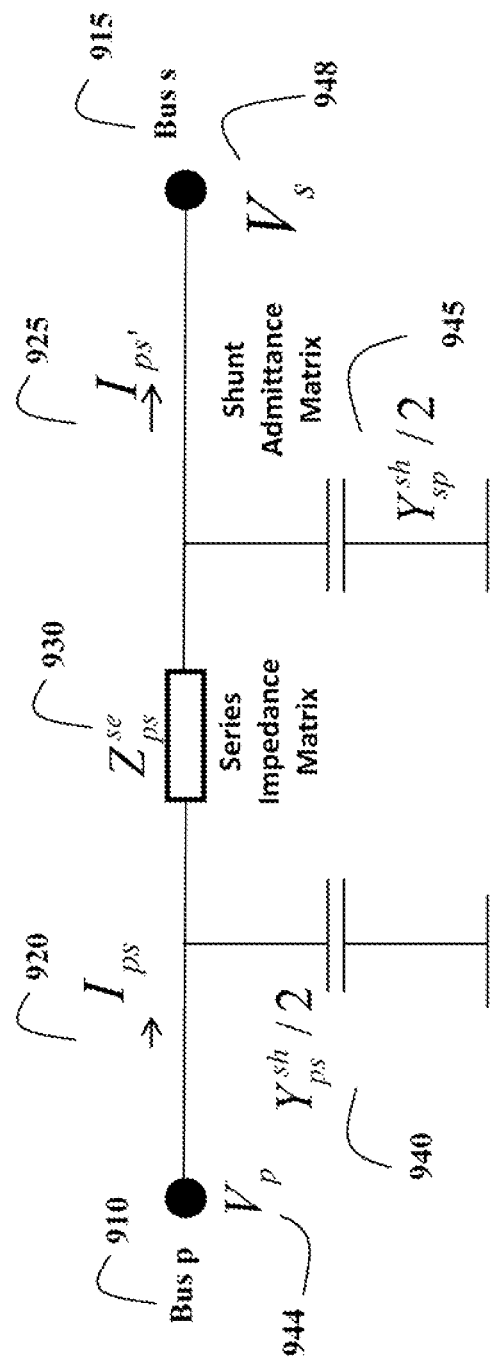
FIG. 9 is a schematic of a line segment with series impedance and shunt admittance.

FIG. 9 shows an example of a line segment 900 between an upstream bus p, 910 and a downstream bus s, 915. The line segment is modeled by a series phase impedance matrix $Z_{ps}^{se}$ 930, and a shunt admittance matrix $Y_{ps}^{sh}$ split into two terminal buses, 940, and 945. The phase-to-ground voltages at bus p and bus s are represented by the vectors $V_p$ 944 and $V_s$ 948, and the phase currents flowing on the line segments are represented by the vectors $I_{ps}$ 920 and $I_{ps'}$, wherein $I_{ps}$ 920 is the vector of currents entering into the line segment through bus p, and $I_{ps'}$ 925 is the vector of currents leaving from the line segment through bus s.

For any line segment or device between, bus p and s, the phase currents leaving from the line segment through bus s, $\tilde{I}_{ps'}$, can be determined based on the equivalent currents of loads connected to the bus s, and the currents flowing into all downstream line segments or devices through the bus s, according to:

$$\tilde{I}_{ps'} = I_s^{Load} + \sum_{i \in DD_s} \tilde{I}_{st}, \tag{48}$$

where $I_s^{Load}$ are the equivalent currents of loads connected to bus s, and defined as:

$$I_s^{load} = \begin{bmatrix} 1 & 0 & -1 \\ -1 & 1 & 0 \\ 0 & -1 & 1 \end{bmatrix} \begin{bmatrix} I_{s,ab}^{load} \\ I_{s,bc}^{load} \\ I_{s,ca}^{load} \end{bmatrix}. \tag{49}$$

$I_{s,xy}^{load}$ is the equivalent load current between phase x and phase y, and determined as:

$$I_{s,xy}^{load} = \frac{S_{s,xy}^*}{V_{s,xy}^*} \quad xy \in \{ab, bc, ca\}, \qquad (50)$$

$S_{s,xy}$ is the power demand of load connected between phase x and y at bus s, $V_{s,xy}$ is the voltage between phase x and y at bus s. $DD_s$ is the set of buses that directly connected with bus s through a line segment or device. $\tilde{I}_{st}$ is the vector of phase currents flowing into a device between bus s and bus t through bus s. Ifs is the bus of an exporting measuring device, its values are directly set as the corresponding measured phase currents.

If the device is located between bus p and s, the currents flowing into the device through bus p, $\tilde{I}_{ps}$ are determined according to:

$$\tilde{I}_{ps} = \tilde{I}_{ps'} + \frac{1}{2} Y_{ps}^{sh}(V_p + V_s). \qquad (51)$$

If the device is a switch, the currents flowing into the device through bus p is the same as the ones leaving the switch through bus s, that is:

$$\tilde{I}_{ps} = \tilde{I}_{ps'}. \qquad (52)$$

For example, the feeder section shown in FIG. 3 includes seven layers. Layers 1, 2, 3, and 4 have one bus each. Layer 1 includes the bus 330 which is the bus of importing measuring device. Layer 2, 3 and 4 includes the buses 340, 350 and 360 respectively. Layer 5 includes the buses 370, 374 and 378. Layer 6 and layer 7 have four buses each. Layer 6 includes the buses 380, 382, 384, and 386. Layer 7 includes the buses 390, 392, 394, and 396. The bus of exporting measuring device, 384 is included in the layer 6. The backward calculation method starts from the line segments connected upstream to the last layer, i.e., layer 7, that is line segment between 380-390, 380-392, 386-394, and 386-396, then moving to line segments connected upstream to layer 6, including line segments between 370-380, 370-382, 374-384, 378-386 and 378-388. The process terminates when the currents of switch between 330 and 340 connected upstream to layer 2 are completed.

Determining the Faulty Line Segments of Faulty Feeder Section

The method for locating the faulty line segment is based on a realization that the phase-to-ground voltage at the faulty phase is substantially equals zero at the faulty location, so the voltage of faulty phase at the downstream bus of the line segment with fault would have different sign than the voltage at the upstream terminal bus, if the currents leaving, the line segment through the downstream bus kept as the same values as the current entering the line segment through the upstream bus.

One embodiment uses a forward sweep method, in which the line segments or devices connected downstream to the buses at the first layer are evaluated first. Then the method proceeds to line segments or devices in the next layers, until all possible line segments are evaluated. In one embodiment, if a line segment is determined as a faulty segment, then the devices or line segments downstream are not checked. If the line segment is the only device in the layer, then the locating process is completed. If there are other line segments in the same layer, the process continues to check those segments to see whether a fault is possibly occurring within the segment.

For a device between an upstream bus p and a downstream bus s, the current entering the device through bus p, $I_{ps}$ is $$I_{ps} = I_{mp'} - I_p^{load} - \sum_{t \in DD_p, t \neq s} \tilde{I}_{pt}, \qquad (53)$$

where $I_{mp'}$ is the vector of currents entering into bus p through a device between bus m and bus p, and bus m is upstream to bus p. $I_p^{load}$ is the equivalent currents of loads at bus p determined using the equations similar as Equation (49) and (50), $DD_p$ is the set of buses that directly connected to bus p downstream. $\tilde{I}_{ps}$ is the determined current of a device between bus p and bus t, and bus t is downstream to bus p.

If bus m is the upstream terminal al bus of importing measuring device, $I_{mp'}$ is set as the current measured at the importing measuring device directly. If the device is a line segment, the phase-to-ground voltages of the downstream bus s can be determined as:

$$V_s = V_p - Z_{ps}^{se}\left(I_{ps} - \frac{1}{2} Y_{ps}^{sh} V_p\right). \qquad (54)$$

If it is a switch, then the phase-to-ground voltages of the downstream bus s can be determined as:

$$V_s = V_p. \qquad (55)$$

After the voltages of the downstream bus of a line segment are determined, some embodiments check whether the magnitude of voltage at faulty phase is close to zero, or the sign of voltage at downstream bus is different from the voltage of the upstream bus. If true, the line segment: is a possible faulty one. If not, this line segment is not faulty, and the currents leaving from the segment through the downstream bus are determined for subsequent analyses of the downstream layers.

For a line segment between bus p and s, the currents leaving the segment through bus s can be determined as:

$$I'_{ps} = I_{ps} - \frac{1}{2} Y_{ps}^{sh}(V_p + V_s). \qquad (56)$$

If the device is a switch, then the currents are determined as:

$$I'_{ps} = I_{ps}. \qquad (57)$$

Equation (58) is used to determine whether the voltage, $V_{p,x}$ the faulty phase x of bus p is sufficiently small:

$$|V_{p,x}| \leq \underline{V_0}, \qquad (58)$$

where, $\underline{V_0}$ is a threshold for zero voltage checking, such as 0.00001 per unit.

Equation (59) is used to check whether the voltages at faulty phase x have changed their signs between the upstream bus and the downstream bus:

$$\cos(|\angle V_{p,x} - \angle V_{s,x}|) \leq \underline{pf} \qquad (59)$$

where, $\underline{pf}$ is a threshold for checking whether the absolute value of angle difference is greater than 90 degree and less than or equal 180 degree, for example Taking FIG. 4 as example, the feeder section shown in the figure can be divided into 6 layers. Layer 1 includes one bus, the bus of importing measuring device, 420. Layer 2 and 3 also have one bus each, bus 430, and 440 respectively. Layer 4 has 3 buses, including bus 450, 454 and 458. Layer 5 and layer six have four buses each. Layer 5 contains bus 460, 462, 464, and 466. Layer 6 contains buses 470, 472, 474, and 476.

One embodiment starts the locating method from the device connected downstream to bus 420 in the layer 1, that is switch 410 connected bus 420 and bus 430. Using Equation (55) and (57), the voltage at bus 430 and current flowing into bus 430 are set by using the measured voltages and currents at the importing measuring device. Then, the method is moving on to the line segment connected to the bus of layer 2, that is the line segment between bus 430 and bus 440. The currents entering through bus 430 into the segment are determined using Equation (53), and the voltage at bus 440 is determined using Equation (54). After the voltage at bus 440 is obtained, Equation (58) or (59) is used to see whether the line segment is a faulty. If either condition is met, the line segment between 430 and 440 is a faulty segment, and the locating process is terminated because the line segment is the only device connected to the layer. Otherwise, the locating method is continued at the line segments between 440 and 450, and 440 and 454 which connected downstream to layer 3. This locating method continues until all possible faulty line segments are located.

Determining the Faulty Locations within Faulty Line Segments

After the faulty line segment is determined, the possible faulty locations along the line segment can be determined to find a location having zero phase-to-ground voltage on the faulty phase.

Figure 10:
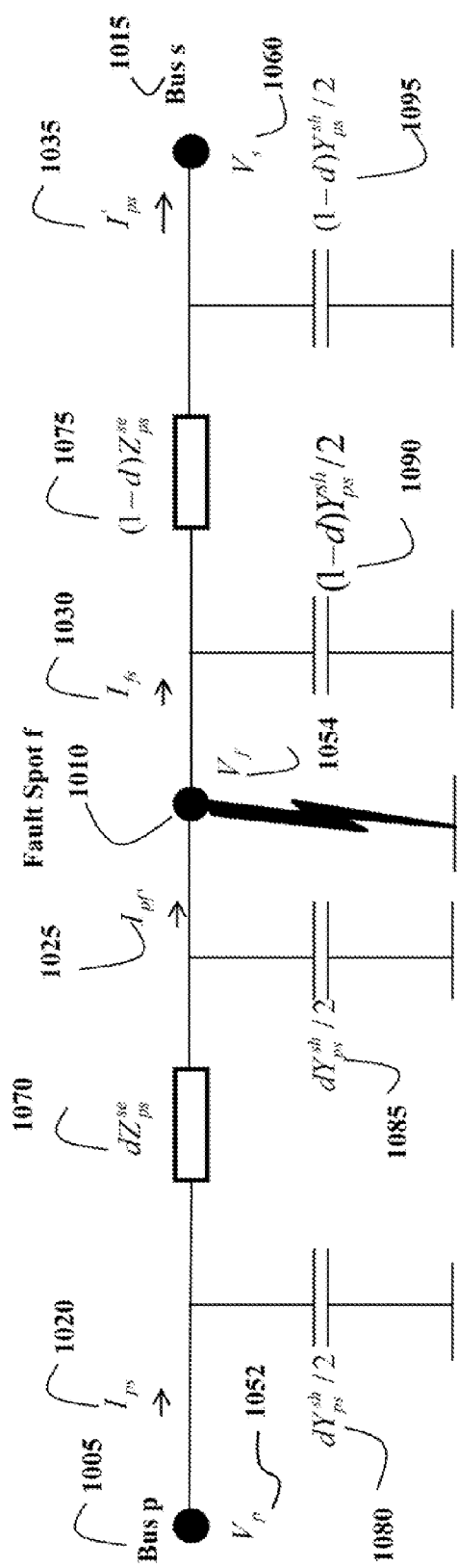
FIG. 10 is a schematic of line segment with a single-phase-to-ground fault.

FIG. 10 shows a model of a line segment with a phase-to-ground fault. The line segment 1000 between bus p 1005 and bus s 1015 includes two sub-segments. One sub-segment is between the upstream bus p 1005 and fault spot f 1010, and the other sub-segment is between fault spot f 1010 and downstream bus s 1015.

If d is the ratio of distance between the fault location and upstream bus p over total length of the line segment, the sub-segment between bus p and bus f is modeled with series impedanced $dZ_{pa}^{se}$, 1070 and shunt admittance $dY_{ps}^{sh}$ split into two terminal buses, 1080 and 1085. The sub-segment between bus f and bus s is modeled with series impedance $(1-d)Z_{ps}^{se}$, 1075 and a shunt admittance $(1-d)Y_{ps}^{sh}$ split into two terminal buses, 1090 and 1095.

The phase-to-ground voltage at the faulty phase x of bus f, $V_{f,x}$ is determined, as:

$$V_{f,x} = V_{p,x} - dZ_{ps,x}^{se}\left(I_{ps} - \frac{1}{2}dY_{ps}^{sh}V_p\right), \quad (60)$$

where $V_{p,x}$ is the phase-to-ground voltage of faulty phase x at the upstream bus p, and $Z_{ps,x}^{se}$ is the vector of series impedance matrix elements corresponding to the row of the faulty phase.

The magnitude of voltage $V_{f,x}$ becomes zero when the device f has a bolted single-phase-to-ground fault. Thus, the location of fault can be determined by solving the root of a complex quadratic equation of distance ratio d:

$$\left(\frac{1}{2}Z_{ps,x}^{se}Y_{ps}^{sh}V_p\right)d^2 - (Z_{ps,x}^{se}I_{ps})d + V_{p,x} = 0. \quad (61)$$

The equation (61) can be solved by a root solving method, such as the bisection method, or Newton's method within a feasible range [0,1] of variable d. After the ratio d is obtained, the exact geographic locations can be derived when the geographic coordinates of two terminal buses of the faulty line segment are known.

Example

Figure 11:
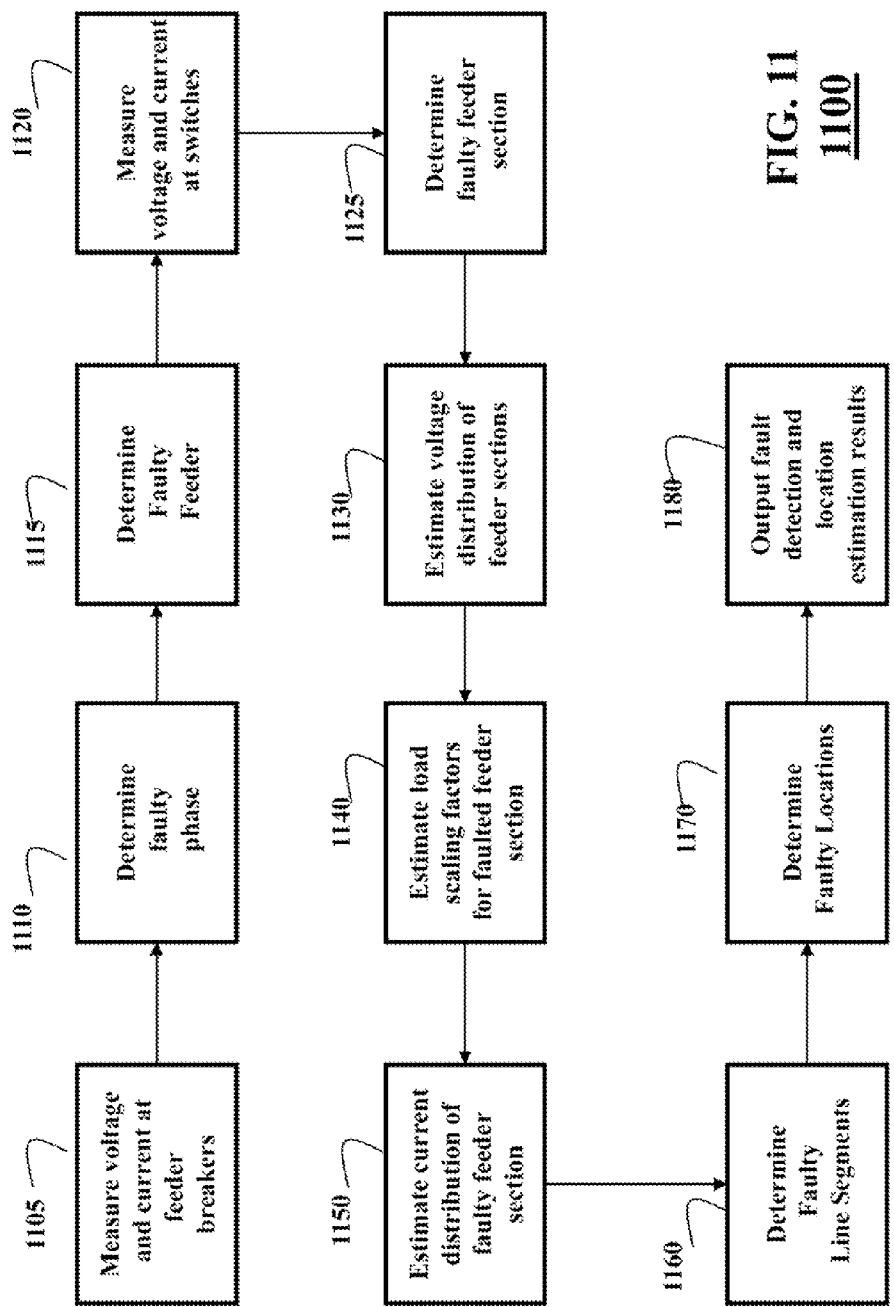
FIG. 11 is a block diagram of a method for locating a bolted single-phase-to-ground fault according to some embodiments of the invention.

FIG. 11 shows a block diagram of a method 1100 for locating a bolted single-to-ground fault in an ungrounded power distribution system according to one embodiment of the invention. Various embodiments of invention use at least part of the steps of the method 1100.

In step 1105, retrieve the voltage and current measurements lot the feeder breakers in the substation.

In step 1110, based on the magnitudes of voltage measurements of one of feeder breaker at different phases, determine the faulty phase of the fault.

In step 1115, based on the residual voltage and current measurements of feeder breakers for different feeders, determine the faulty feeder.

In step 1120, retrieve the voltage and current measurements for the switches with sensors along the faulty feeder.

In step 1125, based on the residual voltage and current measurements determined in step 1120, determine the faulty feeder section which is bounded by the feeder breaker, or switch with sensors.

In step 1130, based on the voltage measurements in the faulty feeder section, the voltage distribution is determined according to system topology connectivity. If the measurements before the fault are available, only the voltages of faulty section need to be determined. Otherwise, the voltages of the faulty feeder section and all feeder sections downstream to the faulty feeder section are determined.

In step 1140, based on the load profiles and voltage and current measurements, the load scaling factors for determining the load demands of individual loads are determined by using incremental equivalent current or resistance method. If the voltage and current measurements before the fault are known, the scaling factors are determined by directly using those measurements. If the voltage and current measurements during the fault have to be used, then the current Measurements need to adjusted to remove the impacts of faults in the feeder section.

In step 1150, based oil the current measurement and determined voltage distribution, the current distribution of faulty section is determined.

In step 1160, based on the determined current distribution and changes of phase-to-ground voltages between line terminal buses, one or several faulty line segments are determined.

In step 1170, based on the phase-to-ground voltage at the faulty phase, a possible fault is located for each possible faulty line segments.

In step 1180, output the fault locating results, such as faulty phase, faulty feeder, faulty feeder section, possible faulty line segments, and possible geographic locations of faults to the distribution automation systems.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

The terms "program" or "software" are used herein in a generic sense to refer to any type of computer code or set of computer-executable instructions that can be employed to program a computer or other processor to implement various aspects of the present invention as discussed above.

Computer-executable instructions may be in many forms, such as program modules, executed by one or more computers or other devices. Generally, program modules include routines, programs, objects, components, data structures that perform particular tasks or implement particular abstract data types. Typically the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described with reference to certain preferred embodiments, it is to be understood that various other adaptations and modifications can be made within the spirit and scope of the invention. Therefore, it is the object of the append claims to cover all such variations and modifications as come within the true spirit and scope of the invention.

The invention claimed is:

1. A method for determining a location of a fault in an ungrounded power distribution system, wherein the power distribution system includes a set of feeders connected to a substation, wherein each feeder includes a set of loads connected by line segments and each line segment is defined by a pair of buses, and the fault is a bolted single-phase-to-ground fault, comprising:
   detecting the fault on a faulty phase in the distribution system having the fault;
   comparing, in response to detecting the fault, a difference between an phase angle of a voltage and a phase angle of a current measured at a root of each feeder from the set of feeders to determine a faulty feeder having the fault;
   comparing a difference between a phase angle of a voltage and a phase angle of a current measured at boundaries of each section of the faulty feeder to determine a faulty section having the fault;
   testing each line segment of the faulty section for a change of a sign of a voltage on the faulty phase in the faulty section to determine a faulty line segment; and
   determining a distance from a terminal bus of the faulty line segment to a location along the faulty line segment having a value the voltage on the faulty phase equals zero to produce the location of the fault, wherein steps of the method are performed by a processor.

2. The method of claim 1, further comprising:
determining the faulty phase based on comparison of phase-to-ground voltages measured at roots of each feeder in the set of feeders with lower and upper thresholds.

3. The method of claim 1, further comprising:
determining the faulty feeder by comparing reactive power factors of residual powers at the root of a feeder with an upper and a lower threshold using a sine of angular difference between a residual voltage and a residual current measured at the roots of the feeder.

4. The method of claim 1, further comprising:
determining the faulty section by comparing reactive power factors of residual powers at boundaries of a feeder section with an, upper and a lower thresholds using a sine of an angular difference between a residual voltage and a residual current measured at the boundaries of the feeder section.

5. The method of claim 1, further comprising:
determining the faulty line segment by testing sequentially starting from an upstream line segment, the change of the sign of the voltages on the faulty phase at the buses of line segments of the faulty section by comparing a cosine of an absolute angular difference of voltages on the faulty phase at the buses of line segments against an negative upper threshold.

6. The method of claim 5, further comprising:
determining the voltages at the buses of the faulty line segment based on voltages and current measured at a root of the faulty section, equivalent currents of loads connected to the buses, and equivalent current on line segments adjacent to the faulty line segment using impedance between two buses and shunt admittances at each bus.

7. The method of claim 6, further comprising:
determining the equivalent currents of the adjacent line segment by sequentially determining currents on each line segment in an upstream direction towards the root of the feeder section, wherein the current flowing through a downstream bus of each line segment equals to a sum of equivalent currents of loads connected to the downstream bus and currents downstream from the downstream bus, wherein the current flowing through an upstream bus of each line segment equals to a sum of the current flowing at a corresponding downstream bus, and shunt current resulting from shunt admittances of the line segment.

8. The method of claim 7, further comprising:
determining the shunt current of the line segment based on products of shunt admittances of the line segment and voltage at the buses of the line segment.

9. The method of claim 8, further comprising:
determining the set of voltages based on the voltages measured at the boundaries of the feeder section and lengths of the line segments, wherein the voltage of a study bus residing on a path between an upstream boundary and a downstream boundary is a weighted average of the measured voltages with relative distances to the study bus.

10. The method of claim 1, further comprising:
determining the distance to the location along the faulty line segment with zero value of the voltage of the faulty phase based on proportionality of the distance with impedance of the line segment and a proportionality of the distance With a shunt admittance of the line segment.

11. The method of claim 10, wherein the determining the distance is according to $$\left(\frac{1}{2}Z^{se}_{ps,x}Y^{sh}_{ps}V_p\right)d^2 - (Z^{se}_{ps,x}I_{ps})d + V_{p,x} = 0,$$

wherein d is a ratio of distance of fault spot to an upstream bus of the fault line segment between an upstream bus p and a downstream bus s over a length of line segment, x is the faulty phase, $Z_{ps,x}^{se}$ is the vector of series phase impedance elements of the faulty line segment at a row corresponding, to the faulty phase, $Y_{ps}^{sh}$ is a shunt admittance matrix of faulty line segment, $V_p$ is a vector of phase-to-ground voltages at bus p, $I_{ps}$ is the vector of phase currents entering the line segment through bus p, and $V_{p,x}$ is a phase-to-ground voltage at a phase x.

12. The method of claim 1, wherein the current and the voltage are measured during the fault.

13. The method of claim 1, wherein borders of the faulty feeder section are defined by an importing device connecting the faulty feeder section to an upstream feeder section, and by at least one exporting device connecting the faulty feeder section with a downstream feeder section, further comprising:
  representing a power consumption of each load in the faulty feeder section as a product of a scaling factor and a base power defined by a load profile of the load;
  solving a power flow of the faulty feeder section using the power consumptions of the loads by treating the bus of importing device as a constant voltage bus and the buses of exporting device as a constant power bus to produce an active power for each phase of the importing device;
  determining a target active power for each phase of the importing device using measurements at the importing device; and
  updating the scaling factors based on a difference between the active power and the target active power of the importing device.

14. The method of claim 13, further comprising:
  repeating the solving, the determining, and the updating until a difference between the active and the target power is below a threshold.

15. The method of claim 13, further comprising:
  determining the active power is determined according to $$P_{im,x}^{calculated} = |V_{im,x}||I_{im,x}^{calculated}|\cos(\angle V_{im,x} - \angle I_{im,x}^{calculated}),$$

wherein $P_{im,x}^{calculated}$ is the active power on a phase x at the importing device, $x \in \{a,b,c\}$, wherein a, b, c are phases of the importing device, $|V_{im,x}|$ and $\angle V_{im,x}$ are a magnitude and a phase angle of a phase-to-ground voltage on the phase x measured at the importing device, $|I_{im,x}^{calculated}|$ and $\angle I_{im,x}^{calculated}$ are a magnitude and a phase angle of a phase current on the phase x through the importing device into the feeder section; and
  determining the target active power $P_{im,x}$ on the phase x at the importing device according to $$P_{im,x} = |V_{im,x}||\hat{I}_{im,x}|\cos(\angle V_{im,x} - \angle \hat{I}_{im,x}),$$

wherein $\hat{I}_{im,x}$ is a phase current on the phase x with removed contribution of a shunt current resulting from a single-phase-to-ground fault on the phase x determined according to $$\hat{I}_{im,x} = I_{im,x} - TI_{im} + I_{im}^{shunt},$$

where $I_m$ is a vector of phase currents measured at the importing device during the fault, $T=[1\ 1\ 1]$, and $I_{im}^{shunt}$ is the shunt current.

16. The method of claim 15, further comprising:
  determining the shunt current as a sum of shunt currents of the line segments of the feeder section determined based on a shunt admittance matrix of each line segment.

17. The method of claim 13, further comprising:
  determining a set of WYE-connected resistances based on the difference between the active and the target active powers at each phase and phase-to-ground voltages measured at the importing device;
  determining a set of DELTA-connected resistances using a WYE-DELTA transformation of equivalent resistances of active powers;
  determining incremental phase-to-phase powers based on the set of DELTA-connected resistances and the phase-to-ground voltages measured at the importing device;
  determining incremental scaling factors using a ratio of the phase-to-phase incremental active power and the base active power defined by the load profile; and
  updating the scaling factors based on the incremental scaling factors.

18. The method of claim 13, further comprising:
  determining a current mismatch for each phase at the importing device;
  determining incremental phase-to-phase currents based on the current mismatch;
  determining incremental phase-to-phase powers based the incremental phase-to-phase currents and the phase-to-ground voltages measured at the importing device;
  determining incremental scaling factors using a ratio of the phase-to-phase incremental active power and the base active power defined by the load profile; and
  updating the scaling factors based on the incremental scaling factors.

19. A system for determining, a location of a fault in an ungrounded power distribution system, wherein the power distribution system includes a set of feeders connected to a substation, wherein each feeder includes a set: of loads connected by line segments and each line segment: is defined by a pair of buses, and the fault is a bolted single-phase-to-ground fault, comprising a processor for:
  comparing, in response to detecting the fault on a faulty phase of a wire in the distribution system, a difference between an angle of a voltage and an angle of a current measured at a root of each feeder from the set of feeders to determine a faulty feeder having the fault;
  comparing a difference between art angle of a voltage and an angle of a it current measured at boundaries of each section of the faulty feeder to determine a faulty section having the fault;
  testing each line segment of the faulty section for a change of a sign of a voltage on the faulty phase in the faulty section to determine a faulty line segment; and
  determining a distance from a terminal bus of the faulty line segment to a location along the faulty line segment having a value the voltage on the faulty phase equals zero based on proportionality of the distance with impedance of the line segment and a proportionality of the distance with a shunt admittance of the line segment to produce the location of the fault.

* * * * *